US011545089B2

(12) United States Patent
Li et al.

(10) Patent No.: US 11,545,089 B2
(45) Date of Patent: Jan. 3, 2023

(54) PIXEL DRIVING CIRCUIT, DISPLAY PANEL AND ELECTRONIC DEVICE

(71) Applicants: Hefei BOE Joint Technology Co., Ltd., Hefei (CN); BOE TECHNOLOGY GROUP CO., LTD., Beijing (CN)

(72) Inventors: Meng Li, Beijing (CN); Yongqian Li, Beijing (CN); Chen Xu, Beijing (CN); Dacheng Zhang, Beijing (CN); Jingquan Wang, Beijing (CN); Shi Sun, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/280,283

(22) PCT Filed: May 15, 2020

(86) PCT No.: PCT/CN2020/090652
§ 371 (c)(1),
(2) Date: Mar. 26, 2021

(87) PCT Pub. No.: WO2021/227064
PCT Pub. Date: Nov. 18, 2021

(65) Prior Publication Data
US 2022/0013067 A1 Jan. 13, 2022

(51) Int. Cl.
G09G 3/3233 (2016.01)
G09G 3/3266 (2016.01)
G09G 3/3275 (2016.01)

(52) U.S. Cl.
CPC ......... *G09G 3/3233* (2013.01); *G09G 3/3266* (2013.01); *G09G 3/3275* (2013.01); *G09G 2310/0278* (2013.01)

(58) Field of Classification Search
CPC .. G09G 3/3233; G09G 3/3266; G09G 3/3275; G09G 2310/0278;
(Continued)

(56) References Cited

U.S. PATENT DOCUMENTS 10,361,391 B2 7/2019 Kim et al.
10,535,290 B2 1/2020 Choi et al.
(Continued)

FOREIGN PATENT DOCUMENTS

CN 106935619 A 7/2017
CN 206364017 U 7/2017
(Continued)

OTHER PUBLICATIONS

Extended European Search Report, for European Patent Application No. 20 904 245.6, dated Sep. 8, 2022, 12 pages.

*Primary Examiner* — Sanjiv D. Patel
(74) *Attorney, Agent, or Firm* — Westman, Champlin & Koehler, P.A.

(57) ABSTRACT

A pixel driving circuit, a display device and an electronic device are provided. The pixel driving circuit includes: a first sub-pixel driving circuit, a second sub-pixel driving circuit, a third sub-pixel driving circuit, and a fourth sub-pixel driving circuit sequentially arranged in a first direction; a detection line; a first power line extending in the second direction; and a second power line extending in the second direction, wherein one of the first power line and the second power line is provided on a side of the second sub-pixel driving circuit away from the third sub-pixel driving circuit, and the other of the first power line and the second power (Continued)

line is provided on a side of the third sub-pixel driving circuit away from the second sub-pixel driving circuit.

18 Claims, 23 Drawing Sheets

(58) Field of Classification Search
CPC ... G09G 2300/0439; G09G 2300/0443; G09G 2300/0456; G09G 2300/046; G09G 2300/043; G09G 2300/0452; H01L 27/32; H01L 27/3276; H01L 27/326
See application file for complete search history.

(56) References Cited

U.S. PATENT DOCUMENTS

| | | | |
|---|---|---|---|
| 10,833,141 | B2 | 11/2020 | Kim |
| 10,861,371 | B2 | 12/2020 | Choi et al. |
| 11,069,881 | B2 | 7/2021 | Jung et al. |
| 2013/0208017 | A1 | 8/2013 | Gu et al. |
| 2014/0097743 | A1* | 4/2014 | Eom .................. H01L 51/5262 445/24 |
| 2015/0357383 | A1 | 12/2015 | Chung et al. |
| 2017/0193876 | A1 | 7/2017 | Choi et al. |
| 2018/0061908 | A1 | 3/2018 | Shim et al. |
| 2018/0190935 | A1 | 7/2018 | Kim et al. |
| 2019/0173057 | A1 | 6/2019 | Jung et al. |
| 2020/0066817 | A1 | 2/2020 | Kim |
| 2020/0074938 | A1* | 3/2020 | Kim .................... G09G 3/3233 |
| 2020/0118477 | A1* | 4/2020 | Choi .................. H01L 27/3276 |
| 2021/0028257 | A1 | 1/2021 | Kim |
| 2021/0056884 | A1 | 2/2021 | Choi et al. |

FOREIGN PATENT DOCUMENTS

| | | |
|---|---|---|
| CN | 108269831 A | 7/2018 |
| CN | 110021627 A | 7/2019 |
| CN | 110416278 A | 11/2019 |
| CN | 110858607 A | 3/2020 |

* cited by examiner

PIXEL DRIVING CIRCUIT, DISPLAY PANEL AND ELECTRONIC DEVICE

CROSS REFERENCE TO RELATED APPLICATIONS

This application is a Section 371 National Stage Application of International Application No. PCT/CN2020/090652, filed on May 15, 2020, entitled "PIXEL DRIVING CIRCUIT, DISPLAY PANEL AND ELECTRONIC DEVICE", the disclosure of which is incorporated herein by reference in its entirety.

TECHNICAL FIELD

The present disclosure relates to the field of display technology, in particular to a pixel driving circuit, a display panel and an electronic device.

BACKGROUND

Transparent display, as a brand-new display technology, allows observers to see a background behind a screen through a display screen. This novel display effect has broadened an application field of the display and has received widespread attention.

SUMMARY

Some embodiments of the present disclosure provide a pixel driving circuit, including: a first sub-pixel driving circuit, a second sub-pixel driving circuit, a third sub-pixel driving circuit, and a fourth sub-pixel driving circuit sequentially arranged in a first direction; a detection line extending in a second direction substantially perpendicular to the first direction and located between the second sub-pixel driving circuit and the third sub-pixel driving circuit, wherein the detection line is configured to obtain a detection sampling signal from each sub-pixel driving circuit; a first power line extending in the second direction and configured to provide a constant first voltage signal to each sub-pixel driving circuit; and a second power line extending in the second direction and configured to provide a constant second voltage signal to a pixel where the pixel driving circuit is located; wherein one of the first power line and the second power line is provided on a side of the second sub-pixel driving circuit away from the third sub-pixel driving circuit, and the other of the first power line and the second power line is provided on a side of the third sub-pixel driving circuit away from the second sub-pixel driving circuit.

In some embodiments, the first power line is provided on a side of the first sub-pixel driving circuit away from the second sub-pixel driving circuit, and the second power line is provided on a side of the fourth sub-pixel driving circuit away from the third sub-pixel driving circuit.

In some embodiments, the first power line is provided on a side of the fourth sub-pixel driving circuit away from the third sub-pixel driving circuit, and the second power line is provided on a side of the first sub-pixel driving circuit away from the second sub-pixel driving circuit.

In some embodiments, the pixel driving circuit further includes: a first data line extending in the second direction, wherein the first data line is located between the first sub-pixel driving circuit and the second sub-pixel driving circuit, and configured to provide a first data signal to the first sub-pixel driving circuit; a second data line extending in the second direction, wherein the second data line is located between the first sub-pixel driving circuit and the second sub-pixel driving circuit, and configured to provide a second data signal to the second sub-pixel driving circuit; a third data line extending in the second direction, wherein the third data line is located between the third sub-pixel driving circuit and the fourth sub-pixel driving circuit, and configured to provide a third data signal to the third sub-pixel driving circuit; and a fourth data line extending in the second direction, wherein the fourth data line is located between the third sub-pixel driving circuit and the fourth sub-pixel driving circuit, and configured to provide a fourth data signal to the fourth sub-pixel driving circuit.

In some embodiments, the first data line is located between the first sub-pixel driving circuit and the second data line; and the second data line is located between the first data line and the second sub-pixel driving circuit.

In some embodiments, the third data line is located between the third sub-pixel driving circuit and the fourth data line; and the fourth data line is located between the third data line and the fourth sub-pixel driving circuit.

In some embodiments, the detection line, the first power line, the second power line, the first data line, the second data line, the third data line, and the fourth data line are made of the same material and provided in the same layer.

In some embodiments, each sub-pixel driving circuit includes: a first transistor including a first gate, a first drain, and a first source, wherein the first gate receives a first scan signal; a second transistor including a second gate, a second drain, and a second source, wherein the second gate is electrically coupled to the first source, and the second drain is electrically coupled to the first power line; and a third transistor including a third gate, a third drain, and a third source, wherein the third gate receives a second scan signal, the third drain is electrically coupled to the detection line, and the third source is electrically coupled to the second source.

In some embodiments, the pixel driving circuit further includes: a detection connection line extending in the first direction, wherein the detection line is electrically coupled to the third drain of the third transistor of each sub-pixel driving circuit through the detection connection line.

In some embodiments, the pixel driving circuit further includes: a power connection line extending in the first direction, wherein the first power line is electrically coupled to the second drain of the second transistor of each sub-pixel driving circuit through the power connection line.

Some embodiments of the present disclosure provide a display panel, including: a base substrate; and a plurality of pixels arranged in an array on the base substrate, wherein each of the at least one pixel includes a light transmission area and a display area that are arranged side by side in a first direction; and each pixel includes the pixel driving circuit according to the embodiments, and wherein the pixel driving circuit is located in the display area.

In some embodiments, in each pixel, the first sub-pixel driving circuit is closer to the light transmission area than the second sub-pixel driving circuit, the third sub-pixel driving circuit, and the fourth sub-pixel driving circuit, and the second power line is provided between the light transmission area and the first sub-pixel driving circuit.

In some embodiments, in each pixel, the fourth sub-pixel driving circuit is closer to the light transmission area than the first sub-pixel driving circuit, the second sub-pixel driving circuit, and the third sub-pixel driving circuit, and the second power line is provided between the light transmission area and the fourth sub-pixel driving circuit.

In some embodiments, in each pixel, the first sub-pixel driving circuit is closer to the light transmission area than the second sub-pixel driving circuit, the third sub-pixel driving circuit, and the fourth sub-pixel driving circuit, and the second power line is provided on a side of the fourth sub-pixel driving circuit away from the light transmission area.

In some embodiments, in each pixel, the fourth sub-pixel driving circuit is closer to the light transmission area than the first sub-pixel driving circuit, the second sub-pixel driving circuit, and the third sub-pixel driving circuit, and the second power line is provided on a side of the first sub-pixel driving circuit away from the light transmission area.

In some embodiments, the plurality of pixels include a first pixel and a second pixel arranged sequentially in the first direction, the display area of the first pixel is adjacent to that of the second pixel, and the pixel driving circuit of the first pixel and the pixel driving circuit of the second pixel share one first power line.

In some embodiments, the plurality of pixels includes a first pixel and a second pixel arranged sequentially in the first direction, the display area of the first pixel is adjacent to that of the second pixel, and the pixel driving circuit of the first pixel and the pixel driving circuit of the second pixel share one electrode auxiliary line.

Some embodiments of the present disclosure provide an electronic device including the display panel according to above embodiments.

BRIEF DESCRIPTION OF THE DRAWINGS

By reading the detailed description of non-restrictive embodiments with reference to the following drawings, other features, purposes and advantages of the present disclosure will become more apparent.

DETAILED DESCRIPTION OF EMBODIMENTS

Figure 1:
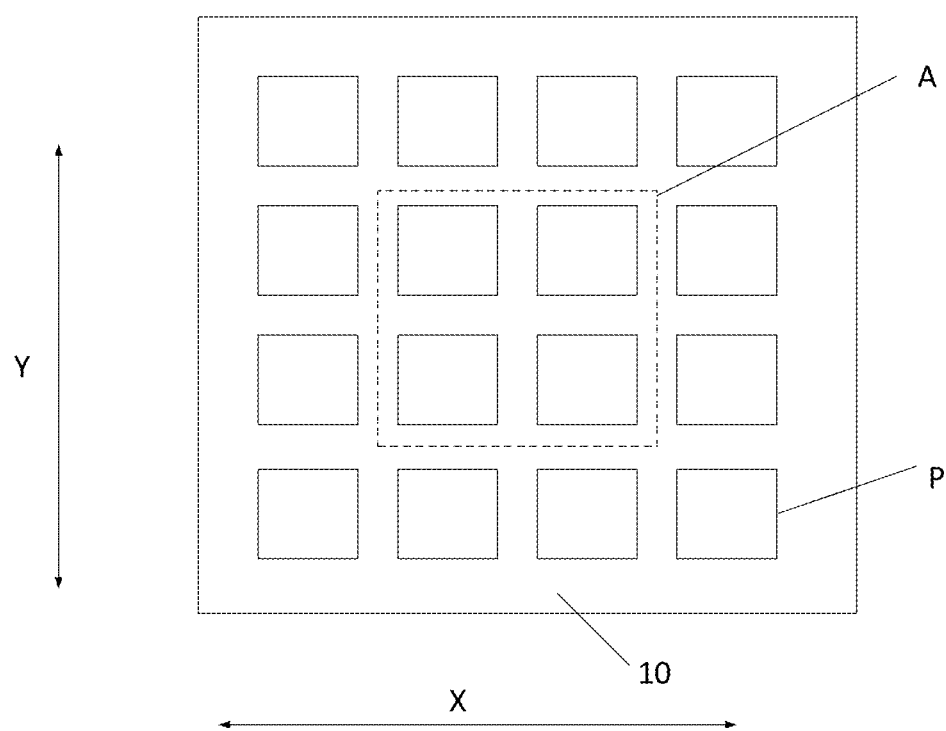
FIG. 1 is a schematic plan view of a transparent display panel according to some embodiments of the present disclosure.

The present disclosure will be further described in detail below with reference to the drawings and embodiments. It should be understood that the specific embodiments described here are only used to explain the related invention, but not to limit the invention. In addition, it should be noted that, for ease of description, only the parts related to the invention are shown in the drawings.

It should be noted that the embodiments in the present disclosure and the features in the embodiments may be combined with each other if there is no conflict.

In addition, in the following detailed description, for ease of explanation, many specific details are set forth to provide a comprehensive understanding of the embodiments of the present disclosure. Obviously, however, one or more embodiments may also be implemented without these specific details.

It should be understood that, although the terms "first", "second", etc. may be used herein to describe different elements, these elements should not be limited by these terms. These terms are only used to distinguish one element from another. For example, without departing from the scope of exemplary embodiments, a first element may be named as a second element, and similarly, the second element may be named as the first element. The term "and/or" as used herein includes any and all combinations of one or more of the related listed items.

It should be understood that when an element or a layer is referred to as being "formed on" another element or layer, the element or the layer may be directly or indirectly formed on the other element or layer. That is, for example, there may be an intermediate element or an intermediate layer. In contrast, when an element or a layer is referred to as being "directly formed on" another element or layer, there is no intermediate element or intermediate layer. Other terms used to describe the relationship between elements or layers should be interpreted in a similar manner (for example, "between" and "directly between", "adjacent" and "directly adjacent", etc.).

The terms used herein are only for the purpose of describing specific embodiments, and are not intended to limit the embodiments. As used herein, unless the context clearly dictates otherwise, the singular form is also intended to include the plural form. It will also be understood that when the terms "comprise" and/or "include" are used herein, it means that the described features, entities, steps, operations, elements and/or components are present, but it does not exclude the presence or addition of one or more other features, entities, steps, operations, elements, components, and/or combinations thereof.

In this disclosure, unless otherwise specified, the expressions "located in the same layer" and "disposed in the same layer" generally mean that a first component and a second component may use the same material and may be formed by the same patterning process. The expressions "located in different layers" and "disposed in different layers" generally indicate that the first component and the second component are formed by different patterning processes.

In the following embodiments herein, take that the transparent display panels are all OLED display panels as examples. Those skilled in the art may understand that the transparent display panels may also be other types of display panels, such as PLED display panels, quantum dot display panels, etc.

Some embodiments of the present disclosure provide a display panel, specifically a transparent display panel. FIG. 1 shows a schematic plan view of a transparent display panel according to some embodiments of the present disclosure. As shown in FIG. 1, the transparent display panel 100 includes a base substrate 10 and a plurality of pixels P arranged in an array on the base substrate 10. A row direction of the pixel array is, for example, a first direction X, a column direction is, for example, a second direction Y, and the first direction X and the second direction Y are perpendicular to each other.

Figure 2:
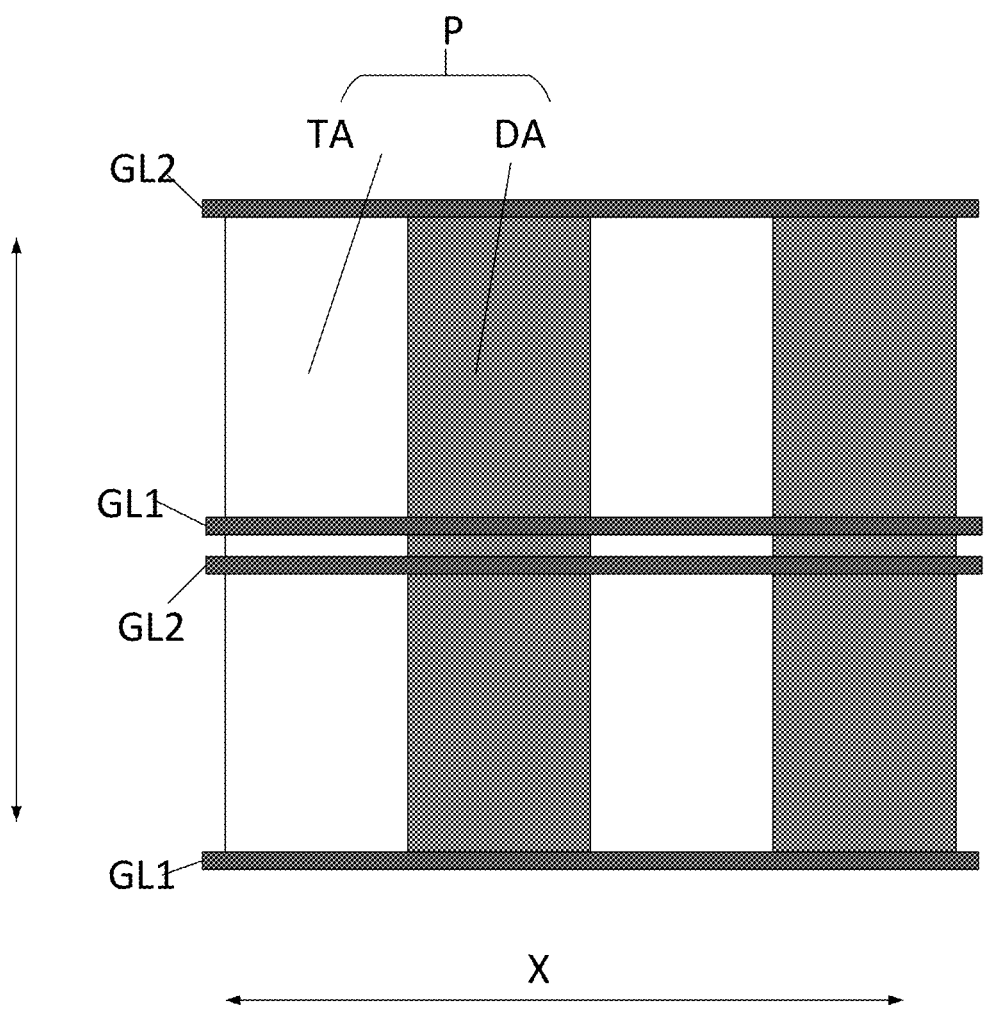
FIG. 2 is an enlarged schematic view of area A in FIG. 1.

FIG. 2 is an enlarged schematic view of area A in FIG. 1, and in FIG. 2, there are only four pixels P are shown. As shown in FIG. 2, each pixel P includes a light transmission area TA and a display area DA. In each pixel P, the light transmission area TA and the display area DA are arranged side by side in the first direction. In the embodiments, as shown in FIG. 2, the light transmission area TA and the display area DA are arranged left and right in each pixel P, and the light transmission area TA is located on the left side of the display area DA. Those skilled in the art should understand that, in other embodiments, the light transmission area TA may be located on the right side of the display area DA. In some embodiments, the light transmission area TA may also be located on the left side of the display area DA in some pixels, and the light transmission area TA is located on the right side of the display area DA in some other pixels.

Figure 3:
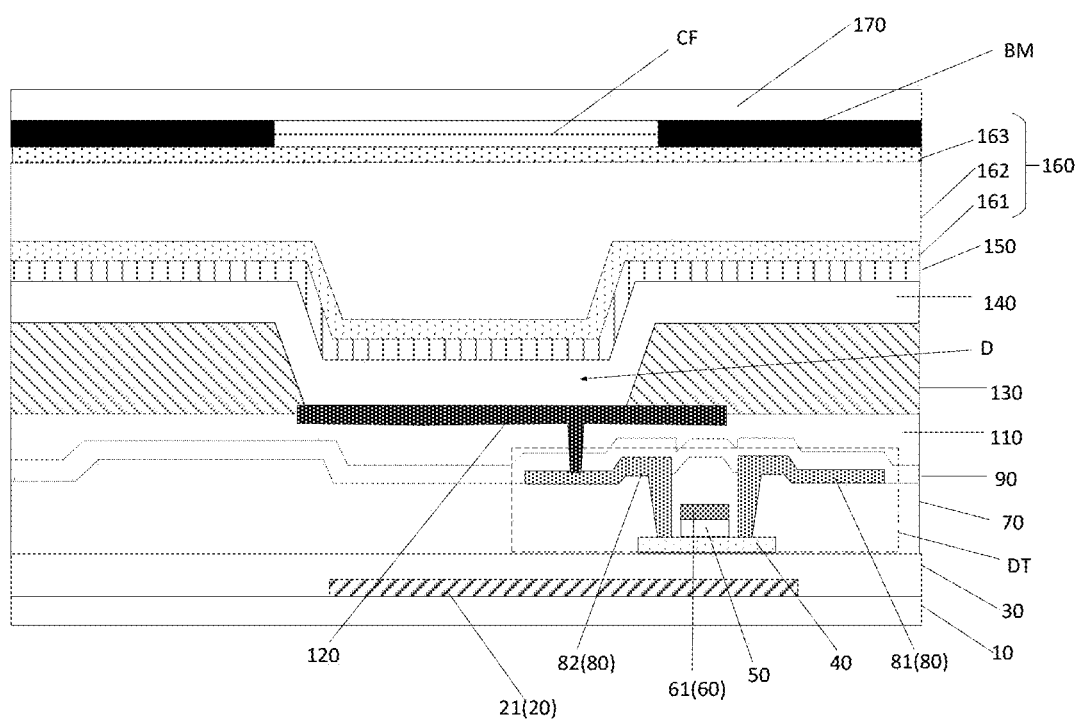
FIG. 3 is a schematic cross-sectional view of a display area of a pixel according to some embodiments of the present disclosure.

FIG. 3 shows a schematic cross-sectional view of a display area of a pixel according to some embodiments of the present disclosure. As shown in FIG. 3, in the display area DA of the pixel P, as shown in FIG. 3, the base substrate 10 is sequentially provided with a first metal layer 20, a first insulating layer 30, an active material layer 40, a second insulating layer 50, a second metal layer 60, a third insulating layer 70, a third metal layer 80, a fourth insulating layer 90, a fifth insulating layer 110, a first electrode layer 120, a pixel defining layer 130, a luminescent material layer 140, a second electrode layer 150, an encapsulation layer 160, a color filter layer CF, a black matrix layer BM and a packaging cover plate 170. In some embodiments, the fourth insulating layer 90 may be omitted.

The base substrate 10 and the packaging cover plate 170 are made of, for example, glass materials with good light transmission characteristics. The first insulating layer 30 is, for example, a buffer layer, and may also be referred to as the buffer layer 30 herein. The second insulating layer 50 is, for example, a gate insulating layer, and may also be referred to as the gate insulating layer 50 herein. The third insulating layer 70 is, for example, an interlayer dielectric layer, and may also be referred to as the interlayer dielectric layer 70 herein. The fourth insulating layer 90 is, for example, a passivation layer, and may also be referred to as the passivation layer 90 herein. The fifth insulating layer 110 is, for example, a planarization layer, and may also be referred to as the planarization layer 110 herein. The planarization layer 110 is formed of an organic material such as resin. The pixel defining layer 130 is also formed of an organic material. In some embodiments, since the planarization layer 110 itself has an insulating effect, the passivation layer 90 may not be provided.

It should be understood that FIG. 3 schematically shows a cross-sectional layer-structure of a single sub-pixel in the pixel display area, which is only used to indicate the layers in the display area, and does not reflect the specific positions of the layers in the plan view.

As shown in FIG. 3, a single sub-pixel includes a driving transistor DT, the first metal layer 20 includes a shielding layer 21, and the active material layer 40 includes an active layer 41 of the driving transistor DT. The shielding layer may be used to shield the active layer 41 of the driving transistor DT, and prevent external light from being incident on the active layer 41 of the driving transistor DT, so as to avoid adverse effects on the display of the sub-pixels. For example, a projection of the active layer 41 of the driving transistor DT on the base substrate falls within a projection of the shielding layer 21 on the base substrate. For example, the single sub-pixel further includes a plurality of switching transistors, and projections of the active layers of the driving transistor and the switching transistors on the base substrate fall within the projection of the shielding layer 21 on the base substrate, or the projections of the active layers of the driving transistor and the switching transistors on the base substrate overlaps the projection of the shielding layer 21 on the base substrate. The second metal layer 60 includes a gate 61 of the driving transistor DT. The third metal layer 80 includes a first electrode 81 of the driving transistor DT, such as a drain, and a second electrode 82, such as a source. The first electrode layer 120 is, for example, an anode layer, which is also referred to as the anode layer 120 herein, including the anode of the light-emitting element D in the sub-pixel. The second electrode layer 150 is, for example, a cathode layer, which is also referred to as the cathode layer 150 herein, including the cathode of the light-emitting element D in the sub-pixel. The encapsulation layer 160 may include a first inorganic layer 161, an organic layer 162, and a second inorganic layer 163 stacked on one side thereof.

In some embodiments, the color filter layer CF and the black matrix BM may be pre-formed on the cover plate 170, and then the cover plate 170 provided with the color filter layer CF and the black matrix BM is aligned and attached to a display substrate, the display substrate being the substrate after the encapsulation layer 160 is formed on the base substrate 10, to form a transparent display panel 100. In some alternative embodiments, the color filter layer CF may be disposed on the display substrate including the base substrate 10, for example, directly disposed on the encapsulation layer 160 or located between the planarization layer 110 and the third metal layer 80. In some embodiments, the black matrix BM may also be replaced by overlapped color filter layers CF of different colors.

In some embodiments, the luminescent material layer 140 is formed on entire surface through an evaporation, as shown in FIG. 3, for example, the light-emitting element D emits white light, and the color filter layer CF transmits different colors in corresponding different sub-pixel regions, thereby achieving colorful display.

In some embodiments, the luminescent material layer 140 may be formed in an opening area of the pixel defining layer 130 by printing, and the sub-pixels of different colors may be printed with luminescent material layers 140 that emit light of different colors. In this case, the color filter layer CF may be omitted, even the cover plate 170 and the black matrix may be omitted.

In some embodiments, at least one of the first metal layer 20, the second metal layer 60, the third metal layer 80, the anode layer 120, the planarization layer 110, the pixel defining layer 130, the black matrix BM and the color filter layer CF that do not transmit light or have poor light transmission effect is not arranged in the light transmission area TA. For example, none of the layers mentioned above are arranged in the light transmission area TA to ensure transparency effect of the light transmission area TA.

In the following embodiments, a structure of a single pixel and a pixel driving circuit of the single pixel in the transparent display panel will be described in detail.

Figure 4:
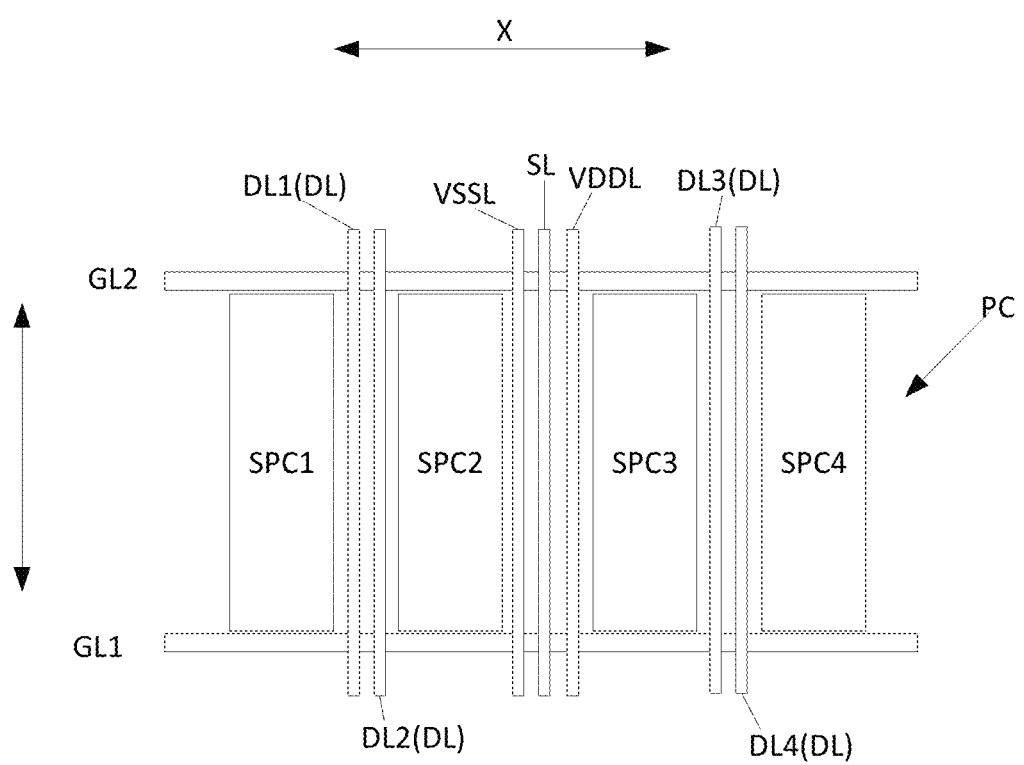
FIG. 4 is a schematic plan view of a display area of a single pixel according to some embodiments of the present disclosure.

Some embodiments of the present disclosure provide a pixel driving circuit of a single pixel of a light transmission display panel. FIG. 4 shows a schematic plan view of a display area of a single pixel according to some embodiments of the present disclosure. As shown in FIG. 4, the display area DA of the pixel P includes four sub-pixels, namely, a first sub-pixel, a second sub-pixel, a third sub-pixel, and a fourth sub-pixel. The four sub-pixels may be a red sub-pixel, a green sub-pixel, a blue sub-pixel, and a white sub-pixel, respectively. Those skilled in the art may understand that each sub-pixel includes a sub-pixel driving circuit and a light-emitting element D located in the sub-pixel driving circuit, and shapes and arrangements of the light-emitting elements of the four sub-pixels may be adjusted according to actual needs, as long as that the sub-pixel driving circuit of each sub-pixel may drive its corresponding light-emitting element D is ensured. In the art, the pixel defining layer is used to define a position and a shape of the light-emitting area of the light-emitting element. The luminescent material layer of the light-emitting element is arranged in the opening of the pixel defining layer. A position and a shape of the opening of the pixel defining layer may be adjusted according to actual needs, so as to adjust the position and shape of the luminescent material layer of the organic light-emitting element.

In order to clearly reflect a structure and a position relationship of each sub-pixel, the light-emitting element of each sub-pixel and the pixel defining layer surrounding each light-emitting element are not shown in FIG. 4. It mainly shows the sub-pixel driving circuits of the first sub-pixel, the second sub-pixel, the third sub-pixel, and the fourth sub-pixel, namely a first sub-pixel driving circuit SPC1, a second sub-pixel driving circuit SPC2, a third sub-pixel driving circuit SPC3 and a fourth sub-pixel driving circuit SPC4. As shown in FIG. 4, the first sub-pixel driving circuit SPC1, the second sub-pixel driving circuit SPC2, the third sub-pixel driving circuit SPC3, and the fourth sub-pixel driving circuit SPC4 are all extending in the second direction Y, and arranged side by side in the first direction X in the pixel P. The first sub-pixel driving circuit SPC1, the second sub-pixel driving circuit SPC2, the third sub-pixel driving circuit SPC3, and the fourth sub-pixel driving circuit SPC4 constitutes the pixel driving circuit of the pixel P. Therefore, FIG. 4 may also be taken as a schematic structural view of a pixel driving circuit of a single pixel according to some embodiments of the present disclosure. In the embodiments, the first sub-pixel driving circuit SPC1, the second sub-pixel driving circuit SPC2, the third sub-pixel driving circuit SPC3, and the fourth sub-pixel driving circuit SPC4 are arranged away from the light transmission area TA of the pixel P in sequence.

In the embodiments, a pixel structure including four sub-pixels is used as an example. Those skilled in the art may understand that in other embodiments, a single pixel may have other numbers of sub-pixels, for example, three sub-pixels, namely, a red sub-pixel, a green sub-pixel and a blue sub-pixel.

Figure 5:
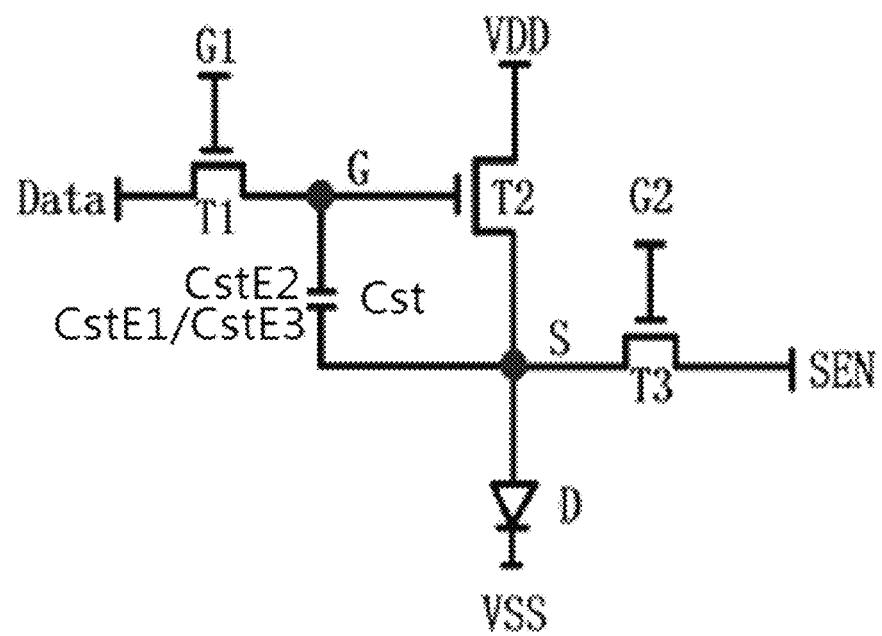
FIG. 5 is a circuit diagram of a single sub-pixel according to some embodiments of the present disclosure.

FIG. 5 is a circuit diagram of a single sub-pixel according to some embodiments of the present disclosure. The single pixel P in the embodiments of the present disclosure will be explained below with reference to FIGS. 4 and 5.

As shown in FIG. 4, each pixel P corresponds to one first gate line GL1, one second gate line GL2, one first power line VDDL, one second power line VSSL, one detection line SL, and four data lines DL. As shown in FIG. 5, each of the first sub-pixel driving circuit SPC1, the second sub-pixel driving circuit SPC2, the third sub-pixel driving circuit SPC3, and the fourth sub-pixel driving circuit SPC4 includes a first transistor T1 (also referred to as a switching transistor T1), a second transistor T2 (also referred to as a driving transistor T2), a third transistor T3 (also referred to as a detection transistor T1), and a storage capacitor Cst. The first gate line GL1 provides a first control signal G1 for each sub-pixel driving circuit. The second gate line GL2 provides a second control signal G2 for each sub-pixel driving circuit. The first data line DL1, the second data line DL2, the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. The first power line VDDL provide a constant first voltage signal, such as a VDD voltage signal, for each sub-pixel driving circuit. The second power line VSSL provides a constant second voltage signal, such as a VSS voltage signal, for each sub-pixel driving circuit. The detection line SL is used to provide a reset signal to each pixel driving circuit, and is used to sample and detect electrical characteristics of each sub-pixel driving circuit, for example, a threshold voltage of the second transistor T2, so as to achieve external compensation and obtain a better display effect.

Specifically, each sub-pixel driving circuit includes a switching transistor T1, a driving transistor T2, a detection transistor T3, and a storage capacitor Cst. The driving transistor T2 is the driving transistor DT in FIG. 3. A gate of the switching transistor T1 receives the first control signal G1 provided by the first gate line GL1. A first electrode of the switching transistor T1, for example, a drain, receives the data signal Data provided by the data line DL. A second electrode of the switching transistor T1, for example, a source, is electrically coupled to a second capacitor electrode CstE2 of the storage capacitor Cst and a gate of the driving transistor T2, and the three are electrically coupled at a first node G. The switching transistor T1 is configured to write the data signal Data into the gate of the driving transistor T2 and the storage capacitor Cst in response to the first control signal G1.

A first electrode of the driving transistor T2, for example, a drain, is electrically coupled to the first power line VDDL through a first power connection line VDDLS, and receives the first voltage signal provided by the first power line VDDL, for example, the VDD voltage signal. A second electrode of the transistor T2, for example, a source, is electrically coupled to a second capacitor electrode CstE2 of the storage capacitor Cst, and is configured to be electrically coupled to the anode of the light-emitting element D. The driving transistor T2 is configured to control the current used to drive the light-emitting element D under the control of the voltage of the gate of the driving transistor T2.

A gate of the detection transistor T3 receives the second control signal G2 provided by the second gate line GL2. A first electrode of the detection transistor T3, for example, a source, is electrically coupled to the second electrode of the driving transistor T2 and the first capacitor electrode CstE1 of the storage capacitor Cst, and the three are electrically coupled at a second node S. A second electrode of the detection transistor T3, for example, a drain, is electrically coupled to the detection line SL through the detection connection line SLS. obtaining the reset signal from the detection line SL and provides a sampling detection signal SEN to the detection line SL. The detection transistor T3 is configured to detect the electrical characteristics of the sub-pixel driving circuit to which it belongs in response to the second control signal G2, to achieve external compensation. The electrical characteristics include, for example, the threshold voltage and/or carrier mobility of the switching transistor T1, or the threshold voltage and driving current of the light-emitting element.

The anode of the light-emitting element D is electrically coupled to the second electrode of the driving transistor T2, for example, the source. The cathode of the light-emitting element D is electrically coupled to the second power line VSSL, for example, through a via hole, to receive a VSS voltage signal. The light-emitting element D emits light based on the current flowing through it, and the luminous intensity is determined by the intensity of the current flowing through the light-emitting element D.

In some embodiments, the storage capacitor Cst may include a third capacitor electrode CstE3 electrically coupled to the first capacitor electrode CstE1. The first capacitor electrode CstE1, the second capacitor electrode CstE2, and the third capacitor electrode CstE3 are sequentially stacked on the base substrate 10. The first capacitor electrode CstE1 and the second capacitor electrode CstE2 have an overlapping area, and the first capacitor electrode CstE1 and the second capacitor electrode CstE2 constitute a first capacitor. The third capacitor electrode CstE3 and the second capacitor electrode CstE2 have an overlapping area, and the third capacitor electrode CstE3 and the second capacitor electrode CstE2 constitute a second capacitor. The storage capacitor Cst may be regarded as a parallel connection of the first capacitor and the second capacitor, thereby increasing the capacitance of the storage capacitor Cst.

The transistors used in the embodiments of the present disclosure may all be thin film transistors or field effect transistors or other switching devices with the same characteristics. In the embodiments of the present disclosure, thin film transistors are taken as examples for description. The source and drain of the transistor used herein may be symmetrical in structure, so there may be no difference in structure between the source and the drain thereof. In the embodiments of the present disclosure, in order to distinguish the two electrodes of the transistor except the gate, one electrode is directly described as a first electrode and the other electrode is a second electrode. In addition, transistors may be divided into N-type and P-type transistors according to their characteristics. When the transistor is a P-type transistor, a turn-on voltage is a low-level voltage (for example, 0V, −5V, −10V or other suitable voltages), and a turn-off voltage is a high-level voltage (for example, 5V, 10V or other suitable voltages). When the transistor is an N-type transistor, the turn-on voltage is a high-level voltage (for example, 5V, 10V or other suitable voltage), and the turn-off voltage is a low-level voltage (for example, 0V, −5V, −10V or other suitable voltage). It should be noted that in the description herein, the N-type transistor is taken as an example for description, but it is not a limitation to the present disclosure.

As shown in FIG. 4, in a region corresponding to the single pixel P, that is, between both ends of the single pixel in the first direction X, both of the first gate line GL1 and the second gate line GL2 extend in the first direction X, all of the first power line VDDL, the second power line VSSL, the detection line SL and the four data lines DL extend in the second direction Y. Specifically, the second power line VSSL, the detection line SL, and the first power line VDDL are sequentially located between the second sub-pixel driving circuit SPC2 and the third sub-pixel driving circuit SPC3 in the first direction X. The second power line VSSL is closer to the second sub-pixel driving circuit SPC2 than the detection line SL and the first power line VDDL, and the first power line VDDL is closer to the third sub-pixel driving circuit SPC3 than the second power line VSSL and the detection line SL. The detection line SL is located between the second power line VSSL and the first power line VDDL. The first data line DL1 and the second data line DL2 are arranged between the first sub-pixel driving circuit SPC1 and the second sub-pixel driving circuit SPC2. The first data line DL1 is closer to the first sub-pixel driving circuit SPC1 than the second data line DL2, and the second data line DL2 is closer to the second sub-pixel driving circuit SPC2 than the first data line DL1. The third data line DL3 and the fourth data line DL4 are arranged between the third sub-pixel driving circuit SPC3 and the fourth sub-pixel driving circuit SPC4. The third data line DL3 is closer to the third sub-pixel driving circuit SPC3 than the fourth data line DL4, and the fourth data line DL4 is closer to the fourth sub-pixel driving circuit SPC4 than the third data line DL3.

When the pixel driving circuit of the pixel P works, the first power line VDDL always maintains a VDD voltage signal, that is, a high voltage signal, and the second power line VSSL always maintains a VSS voltage signal, that is, a low voltage signal. The detection line SL may transmit a pulse of the reset signal, and may also transmit a pulse of the detection signal.

Figure 6:
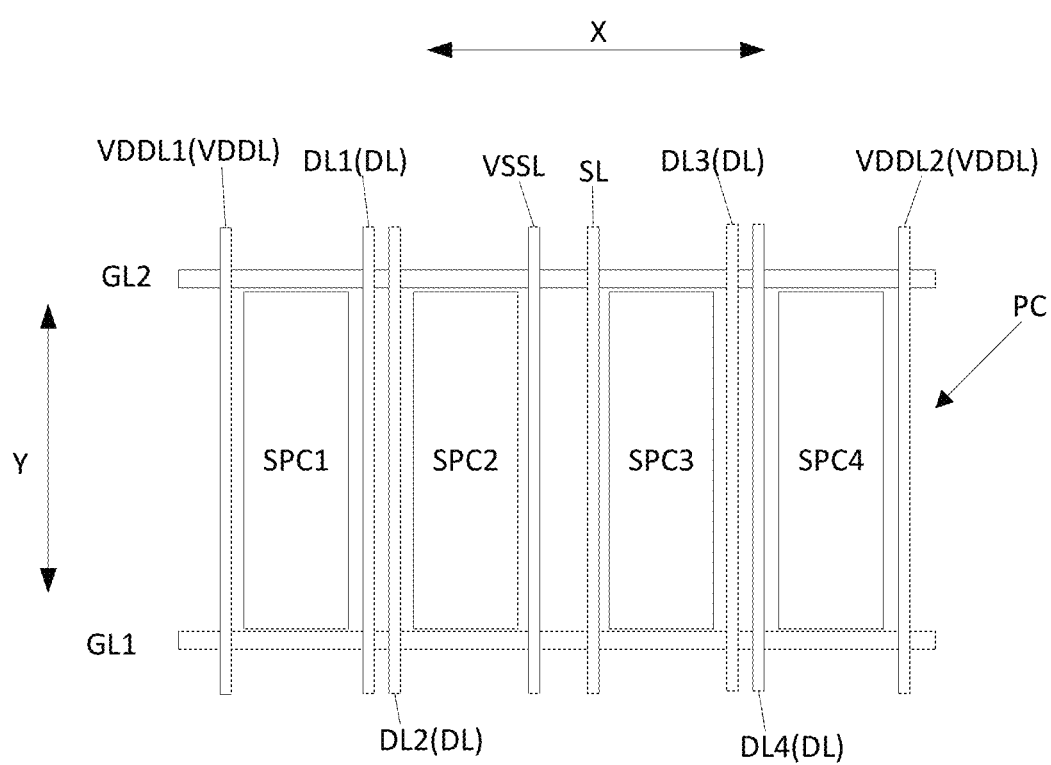
FIG. 6 is a schematic plan view of a display area of a single pixel according to some embodiments of the present disclosure.

Some embodiments of the present disclosure provide a pixel driving circuit for a single pixel of a light transmission display panel. FIG. 6 shows a schematic plan view of a display area of a single pixel according to some embodiments of the present disclosure. A plan structure of the display area of a single pixel shown in FIG. 6 is similar to the plan structure of the display area of the single pixel shown in FIG. 4. Each pixel P includes a first sub-pixel driving circuit SPC1, a second sub-pixel driving circuit SPC2, a third sub-pixel driving circuit SPC3, and a fourth sub-pixel driving circuit SPC4. As shown in FIG. 6, all of the first sub-pixel driving circuit SPC1, the second sub-pixel driving circuit SPC2, the third sub-pixel driving circuit SPC3, and the fourth sub-pixel driving circuit SPC4 extend in the second direction Y, and are arranged side by side in the first direction X in the pixel P. The first sub-pixel driving circuit SPC1, the second sub-pixel driving circuit SPC2, the third sub-pixel driving circuit SP3, and the fourth sub-pixel driving circuit SPC4 constitute the pixel driving circuit of the pixel P. Therefore, FIG. 6 may also be taken as a schematic structural view of a pixel driving circuit of a single pixel according to some embodiments of the present disclosure.

As shown in FIG. 6, each pixel P corresponds to a first gate line GL1, a second gate line GL2, two first power lines VDDL, a second power line VSSL, a detection line SL, and four data lines DL. As shown in FIG. 5, each of the first sub-pixel driving circuit SPC1, the second sub-pixel driving circuit SPC2, the third sub-pixel driving circuit SPC3, and the fourth sub-pixel driving circuit SPC4 includes a first transistor T1, a second transistor T2, a third transistor T3 and a storage capacitor Cst. The first gate line GL1 provides a first control signal G1 for each sub-pixel driving circuit. The second gate line GL2 provides a second control signal G2 for each sub-pixel driving circuit. The first data line DL1, the second data line DL2, the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. One first power line VDDL1 provides a constant first voltage signal, such as voltage signal VDD, for the first sub-pixel driving circuit and the second sub-pixel driving circuit, and the other first power line VDDL2 provide a constant first voltage signal, such as voltage signal VDD, for the third sub-pixel driving circuit and the fourth sub-pixel driving circuit. The second power line VSSL provides a constant second voltage signal, such as voltage signal VSS, for each sub-pixel driving circuit. The detection line SL is used to provide a reset signal for each sub-pixel driving circuit, and is used to detect and sample the electrical characteristics of each sub-pixel driving circuit, such as a threshold voltage of the second transistor T2, so as to achieve an external compensation and obtain a better display effect.

As shown in FIG. 6, both of the first gate line GL1 and the second gate line GL2 extend in the first direction X. All of the two first power lines VDDL, the second power line VSSL, the detection line SL and the four data lines DL extend in the second direction Y. Specifically, the second power line VSSL and the detection line SL are sequentially located between the second sub-pixel driving circuit SPC2 and the third sub-pixel driving circuit SPC3 in the first direction X. The second power line VSSL is closer to the second sub-pixel driving circuit SPC2 than the detection line SL, and the detection line SL is closer to the third sub-pixel driving circuit SPC3 than the second power line VSSL. The first data line DL1 and the second data line DL2 are arranged between the first sub-pixel driving circuit SPC1 and the second sub-pixel driving circuit SPC2. The first data line DL1 is closer to the first sub-pixel driving circuit SPC1 than the second data line DL2, and the second data line DL2 is closer to the second sub-pixel driving circuit SPC2 than the first data line DL1. The third data line DL3 and the fourth data line DL4 are arranged between the third sub-pixel driving circuit SPC3 and the fourth sub-pixel driving circuit SPC4. The third data line DL3 is closer to the third sub-pixel driving circuit SPC3 than the fourth data line DL4, and the fourth data line DL4 is closer to the fourth sub-pixel driving circuit SPC4 than the third data line DL3. The first power line VDDL1 is located on a side of the first sub-pixel driving circuit SPC1 away from the first data line DL1, and the second power line VDDL2 is located on a side of the fourth sub-pixel driving circuit SPC4 away from the fourth data line DL4.

When the pixel driving circuit of the pixel P works, the first power line VDDL1 and the first power line VDDL2 always maintain a VDD voltage signal, that is, a high voltage signal, and the second power line VSSL always maintains a VSS voltage signal, that is, a low voltage signal. The detection line SL may transmit the pulse of the reset signal, and may also transmit the pulse of the detection signal.

Figure 7:
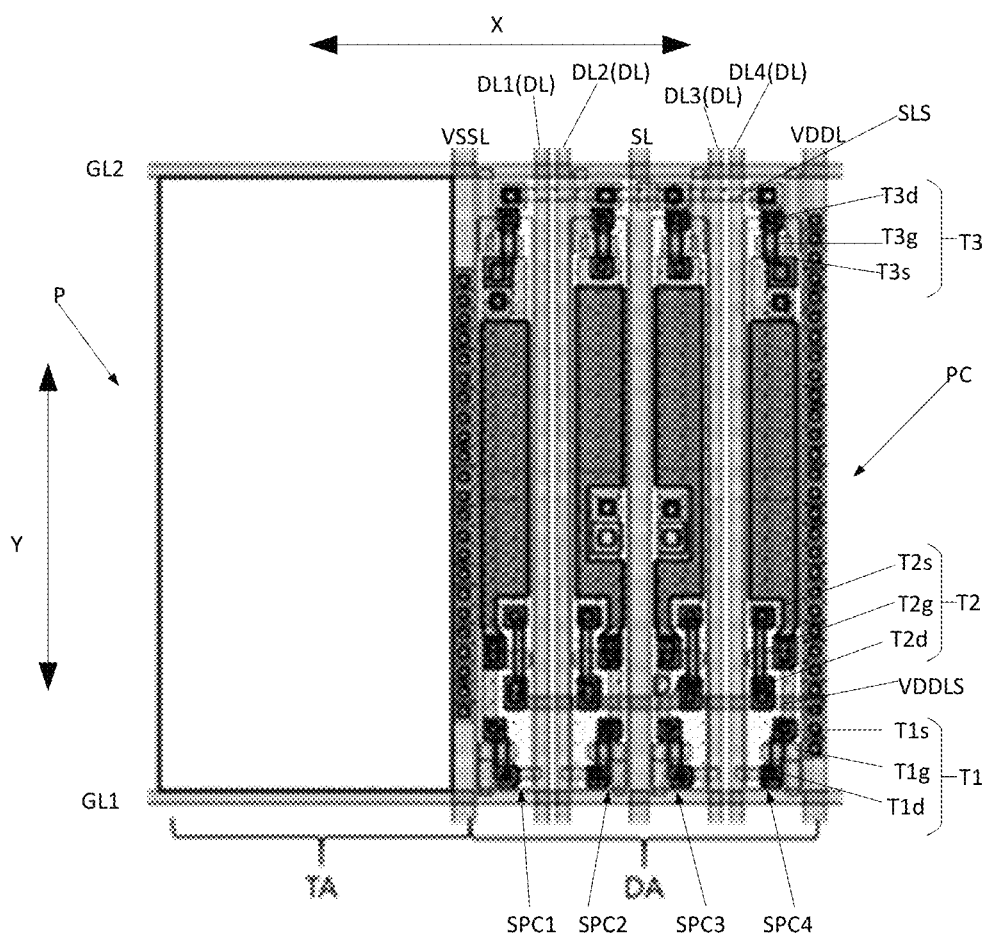
FIG. 7 is a schematic plan view of a single pixel according to some embodiments of the present disclosure.

Some embodiments of the present disclosure provide a pixel driving circuit for a single pixel of a light transmission display panel. FIG. 7 shows a plan structure view of the single pixel according to some embodiments of the present disclosure. In the embodiments, that the light transmission area TA in the single pixel P is located on the left side of the display area DA is taken as an example for description. The display area DA of the pixel P includes four sub-pixels, namely, a first sub-pixel, a second sub-pixel, a third sub-pixel, and a fourth sub-pixel. The four sub-pixels may be a red sub-pixel, a green sub-pixel, a blue sub-pixel and a white sub-pixel. Those skilled in the art may understand that each sub-pixel includes a sub-pixel driving circuit and a light-emitting element D located on the sub-pixel driving circuit, and the light-emitting elements of the four sub-pixels may be adjusted in shape and arrangement according to actual needs, as long as that the sub-pixel driving circuit of each sub-pixel may drive its corresponding light-emitting element D is ensured. In the art, the pixel defining layer is used to define a position and a shape of the light-emitting element. The light-emitting element is arranged in the opening of the pixel defining layer. A position and a shape of the opening of the pixel defining layer may be adjusted according to actual needs, so that the position and the shape of the organic light-emitting element is adjusted.

In order to clearly reflect the structure and the position relationship of each sub-pixel, the light-emitting element of each sub-pixel and the pixel defining layer surrounding each light-emitting element are not shown in FIG. 7. It mainly shows the sub-pixel driving circuits of the first sub-pixel, the second sub-pixel, the third sub-pixel and the fourth sub-pixel, namely a first sub-pixel driving circuit SPC1, a second sub-pixel driving circuit SPC2, and a third sub-pixel driving circuit SPC3 and a fourth sub-pixel driving circuit SPC4. As shown in FIG. 7, all of the first sub-pixel driving circuit SPC1, the second sub-pixel driving circuit SPC2, the third sub-pixel driving circuit SPC3, and the fourth sub-pixel driving circuit SPC4 extend in the second direction Y, and are arranged side by side in the first direction X in the pixel P. The first sub-pixel driving circuit SPC1, the second sub-pixel driving circuit SPC2, the third sub-pixel driving circuit SCP3, and the fourth sub-pixel driving circuit SPC4 constitute the pixel driving circuit PC of the pixel P. Therefore, FIG. 7 may also be taken as a schematic structural view of a pixel driving circuit for a single pixel according to some embodiments of the present disclosure.

As shown in FIG. 7, each pixel P corresponds to a first gate line GL1, a second gate line GL2, a first power line VDDL, a second power line VSSL, a detection line SL, and four data lines DL. As shown in FIG. 5, each of the first sub-pixel driving circuit SPC1, the second sub-pixel driving circuit SPC2, the third sub-pixel driving circuit SPC3, and the fourth sub-pixel driving circuit SPC4 includes a first transistor T1, a second transistor T2, a third transistor T3 and a storage capacitor Cst. The positions of the first transistor T1, the second transistor T2 and the third transistor T3 in each sub-pixel driving circuit are marked in FIG. 7. The first gate line GL1 provides a first control signal G1 for each sub-pixel driving circuit. The second gate line GL2 provides a second control signal G2 for each sub-pixel driving circuit. The first data line DL1, the second data line DL2, the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. Specifically, the first data line DL1, the second data line DL2, the third data line DL3, and the fourth data line DL4 provide a first data signal, a second data signal, a third data signal, and a fourth data line signal for the first sub-pixel driving circuit SPC1, the second sub-pixel driving circuit SPC2, the third sub-pixel driving circuit SPC3 and the fourth sub-pixel driving circuit SPC4, respectively. The first power line VDDL provides a constant first voltage signal for each sub-pixel driving circuit, for example, voltage signal VDD, and the second power line VSSL provides a constant second voltage signal for each sub-pixel driving circuit, for example, voltage signal VSS. The detection line SL is used to provide the reset signal to each pixel driving circuit, and is used to detect and sample the electrical characteristics of each sub-pixel driving circuit, such as a threshold voltage of the second transistor T2, so as to achieve an external compensation and obtain a better display effect.

As shown in FIG. 7, both of the first gate line GL1 and the second gate line GL2 extend in the first direction X, and all of the first power line VDDL, the second power line VSSL, the detection line SL and the four data lines DL extend in the second direction Y. Specifically, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2. The first data line DL1 is closer to the first sub-pixel driving circuit SPC1 than the second data line DL2, and the second data line DL2 is closer to the second sub-pixel driving circuit SPC2 than the first data line DLL That is, the first data line DL1 is located between the first sub-pixel driving circuit SPC1 and the second data line DL2, and the second data line DL2 is located between the first data line DL1 and the second sub-pixel driving circuit SPC2. The third data line DL3 and the fourth data line DL4 are arranged between the third sub-pixel driving circuit SPC3 and the fourth sub-pixel driving circuit SPC4. The third data line DL3 is closer to the third sub-pixel driving circuit SPC3 than the fourth data line DL4, and the fourth data line DL4 is closer to the fourth sub-pixel driving circuit SPC4 than the third data line DL3. That is, the third data line DL3 is located between the third sub-pixel driving circuit SPC3 and the fourth data line DL4, and the fourth data line DL4 is located between the third data line DL3 and the fourth sub-pixel driving circuit SPC4. The second power line VSSL is located on a side of the first sub-pixel driving circuit SPC1 away from the first data line DL1, and the first power line VDDL is located on a side of the fourth sub-pixel driving circuit SPC4 away from the fourth data line DL4.

As shown in FIG. 7, in a single pixel P, the first sub-pixel driving circuit SPC1 is closer to the light transmission area TA than the second sub-pixel driving circuit SPC2, the third sub-pixel driving circuit SPC3, and the fourth sub-pixel driving circuit SPC4. The second power line VSSL is located between the light transmission area TA and the first sub-pixel driving circuit SPC1. The first power line VDDL is located on a side of the fourth sub-pixel driving circuit SPC4 away from the light transmission area TA.

In the embodiments, when the pixel driving circuit of the pixel P works, the first power line VDDL always maintains a VDD voltage signal, that is, a high voltage signal, and the second power line VSSL always maintains a VSS voltage signal, that is, a low voltage signal. The detection line SL may transmit a pulse of the reset signal and may transmit a pulse of the detection signal. Between the second sub-pixel driving circuit SPC2 and the third sub-pixel driving circuit SPC3, only the detection line SL is provided. The detection line SL is located far away from the first power line VDDL, the second power line VSSL, and the data line DL, thereby eliminating or reducing signal crosstalk as much as possible.

As shown in FIGS. 7 and 5, each of the first sub-pixel driving circuit SPC1, the second sub-pixel driving circuit SPC2, the third sub-pixel driving circuit SPC3, and the fourth sub-pixel driving circuit SPC4 includes a first transistor T1, a second transistor T2 and a third transistor T3. The first transistor T1 is close to the first gate line GL1, the third transistor T3 is close to the second gate line GL2, and the second transistor T2 is located between the first transistor T1 and the third transistor T3 in the second direction Y.

As shown in FIGS. 7 and 5, the first transistor T1 includes a first gate T1$g$, a first drain T1$d$, and a first source T1$s$. The first gate T1$g$ is electrically coupled to the first gate line GL1 and receives the first control signal G1. The first drain T1$d$ is electrically coupled to a corresponding data line DL, and receives the data signal Data. In some embodiments, the first gate T1$g$ and the first gate line GL1 are arranged in the same layer and formed integrally, and the first drain T1$d$ and a corresponding data line DL are arranged in the same layer and formed integrally.

The second transistor T2 includes a second gate T2$g$, a second drain T2$d$, and a second source T2$s$. The second gate T2$g$ is electrically coupled to the first source T1$s$, and the second drain T2$d$ is electrically coupled to the first power line VDDL, and receives the voltage signal VDD.

The third transistor T3 includes a third gate T3$g$, a third drain T3$d$, and a third source T3$s$. The third gate T3$g$ is electrically coupled to the second gate line GL2, and receives the second control signal G2. The third drain T3$d$ is electrically coupled to the detection line SL. The third source T3$s$ is electrically coupled to the second source T2$s$.

In some embodiments, the third gate T3g and the second gate line GL2 are arranged in the same layer and formed integrally.

In some embodiments, the detection line SL, the first power line VDDL, the second power line VSSL, the first data line DL1, the second data line DL2, the third data line DL3, the fourth data line DL4, and the source and drain of each transistor in each pixel driving circuit are arranged in the same layer, and all of them are located in the third metal layer 80.

In some embodiments, as shown in FIG. 7, the pixel driving circuit PC of the pixel P further includes a power connection line VDDLS. The power connection line VDDLS extends in the first direction X, and the first power line VDDL is coupled to the second drain T2d of the second transistor T2 in each sub-pixel driving circuit through the power connection line VDDLS. The power connection line VDDLS may be arranged in the second metal layer 60, and arranged on the same layer with the first gate line GL1, the second gate line GL2 and the gate of each transistor in each sub-pixel driving circuit. The power connection line VDDLS is electrically coupled to the first power line VDDL through a via hole, and is electrically coupled to the second drain T2d of the second transistor T2 in each sub-pixel driving circuit through the via hole.

In some embodiments, as shown in FIG. 7, the pixel driving circuit PC of the pixel P further includes a detection connection line SLS. The detection connection line SLS extends in the first direction X, and the detection line SL is coupled to the third drain T3d of the third transistor T3 in each sub-pixel driving circuit through the detection connection line SLS. The detection connection line SLS may be located in the first metal layer 20, and is electrically coupled to the detection line SL and the third drain T3d of the third transistor T3 of each sub-pixel driving circuit through a via hole.

Figure 8:
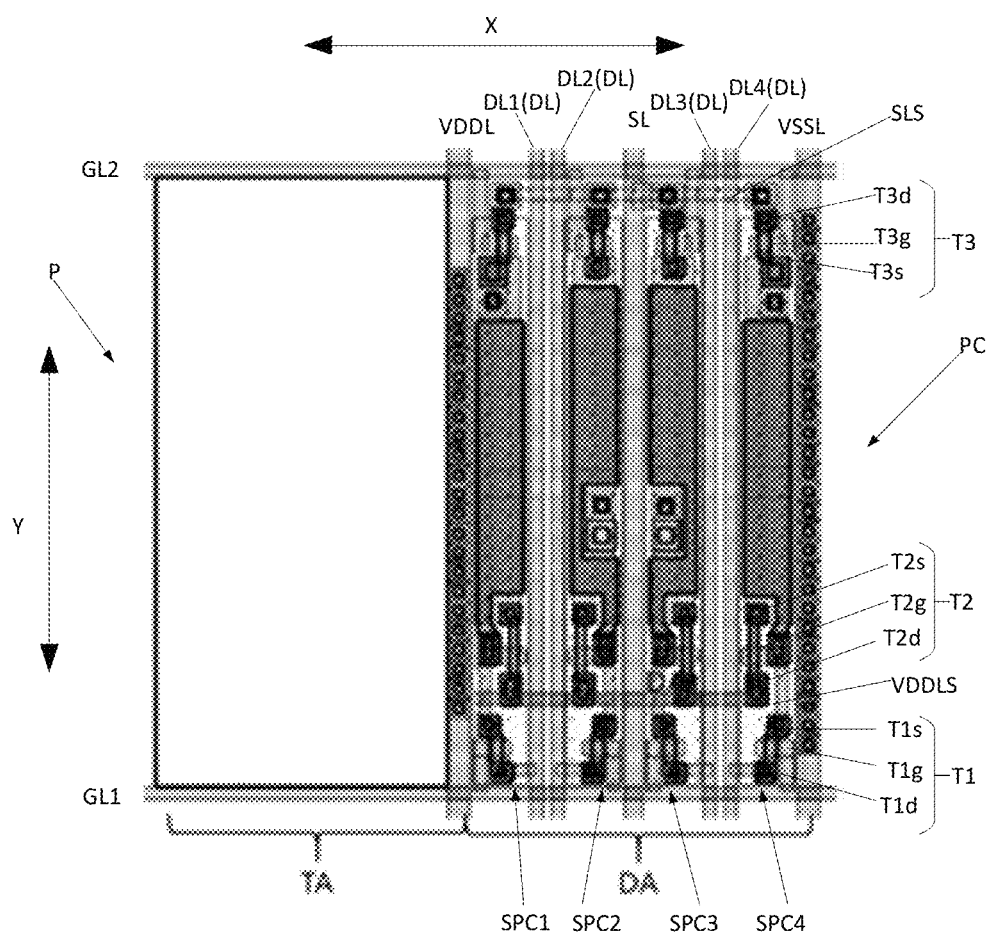
FIG. 8 is a schematic plan view of a single pixel according to some embodiments of the present disclosure.

Some embodiments of the present disclosure provide a pixel driving circuit for a single pixel of a light transmission display panel. FIG. 8 shows a plan structure view of a single pixel according to some embodiments of the present disclosure. The structure of the pixel driving circuit for a single pixel shown in FIG. 8 is basically the same as the structure of the pixel driving circuit for a single pixel shown in FIG. 7, and similarities therebetween are not repeated here. The difference therebetween mainly lies in exchanging positions of the first power line VDDL and the second power line VSSL2.

As shown in FIG. 8, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2. The third data line DL3 and the fourth data line DL4 are arranged between the third sub-pixel driving circuit SPC3 and the fourth sub-pixel driving circuit SPC4. The first power line VDDL is located on a side of the first sub-pixel driving circuit SPC1 away from the first data line DL1. The second power line VSSL is located on a side of the fourth sub-pixel driving circuit SPC4 away from the fourth data line DL4. In the single pixel P, the first sub-pixel driving circuit SPC1 is closer to the light transmission area TA than the second sub-pixel driving circuit SPC2, the third sub-pixel driving circuit SPC3, and the fourth sub-pixel driving circuit SPC4. The first power line VDDL is located between the light transmission area TA and the first sub-pixel driving circuit SPC1, and the second power line VSSL is located on a side of the fourth sub-pixel driving circuit SPC4 away from the light transmission area TA.

In the embodiments, when the pixel driving circuit of the pixel P works, the first power line VDDL always maintains a VDD voltage signal, that is, a high voltage signal, and the second power line VSSL always maintains a VSS voltage signal, that is, a low voltage signal. The detection line SL may transmit a pulse of the reset signal, and may transmit a pulse of the detection signal. Between the second sub-pixel driving circuit SPC2 and the third sub-pixel driving circuit SPC3, only the detection line SL is provided, and the detection line SL is located far away from the first power line VDDL, the second power line VSSL, and the data line DL, thereby eliminating or reducing signal crosstalk as much as possible.

Figure 9:
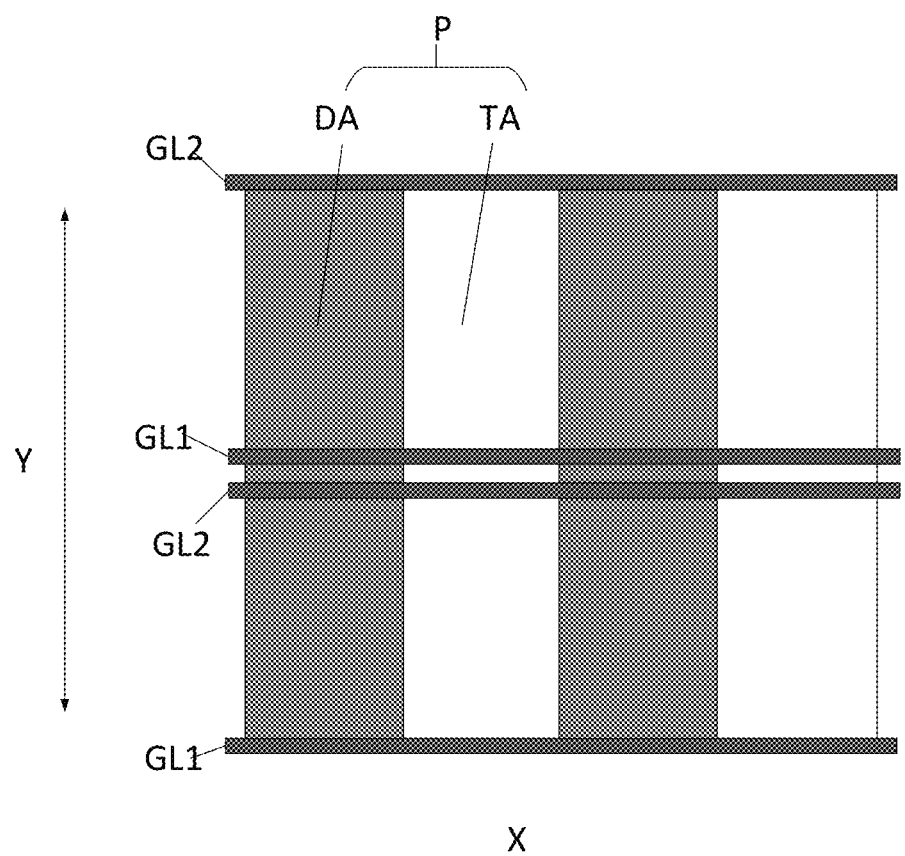
FIG. 9 is an enlarged schematic view of area A in FIG. 1.

FIG. 9 is an enlarged schematic view of the area A in FIG. 1, and only four pixels P are shown in FIG. 9. As shown in FIG. 9, each pixel P includes a light transmission area TA and a display area DA. In each pixel P, the light transmission area TA and the display area DA are arranged side by side in the first direction. As shown in FIG. 9, the light transmission area TA and the display area DA are arranged left and right in each pixel P. In the embodiments, the difference from the structure shown in FIG. 2 is that the light transmission area TA is located on the right side of the display area DA.

Figure 10:
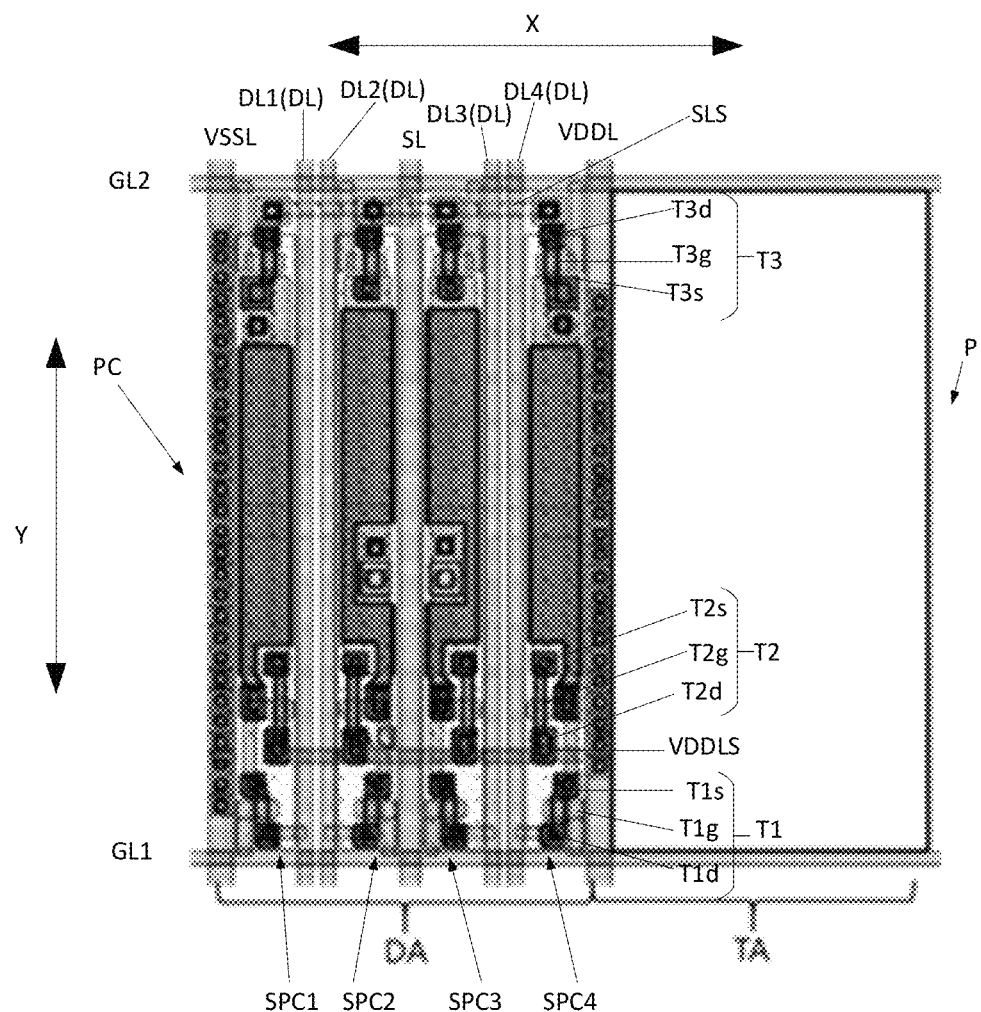
FIG. 10 is a schematic plan view of a single pixel according to some embodiments of the present disclosure.

FIG. 10 shows a plan view of the single pixel in FIG. 9. The structure of the single pixel in FIG. 10 is basically the same as that shown in FIG. 7. The similarities therebetween are not repeated here. The difference therebetween mainly lies in that the light transmission area TA is located on a side of the fourth sub-pixel driving circuit SPC away from the first sub-pixel driving circuit SPC1, the second sub-pixel driving circuit SPC2, and the third sub-pixel driving circuit SPC3, that is, the fourth sub-pixel driving circuit SPC4 is closer to the light transmission area TA than the first sub-pixel driving circuit SPC1, the second sub-pixel driving circuit SPC2 and the third sub-pixel driving circuit SPC3.

As shown in FIG. 10, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2, and the third data line DL3 and the fourth data line DL4 are arranged between the third sub-pixel driving circuit SPC3 and the fourth sub-pixel driving circuit SPC4. The second power line VSSL is located on a side of the first sub-pixel driving circuit SPC1 away from the first data line DL1. The first power line VDDL is located on a side of the fourth sub-pixel driving circuit SPC4 away from the fourth data line DL4. In the single pixel P, the fourth sub-pixel driving circuit SPC4 is closer to the light transmission area TA than the first sub-pixel driving circuit SPC1, the second sub-pixel driving circuit SPC2, and the third sub-pixel driving circuit SPC3. The first power line VDDL is located between the light transmission area TA and the fourth sub-pixel driving circuit SPC4, and the second power line VSSL is located on a side of the first sub-pixel driving circuit SPC1 away from the light transmission area TA.

In the embodiments, when the pixel driving circuit of the pixel P works, the first power line VDDL always maintains a VDD voltage signal, that is, a high voltage signal, and the second power line VSSL always maintains a VSS voltage signal, that is, a low voltage signal. The detection line SL may transmit a pulse of the reset signal and may transmit a pulse of the detection signal. Between the second sub-pixel driving circuit SPC2 and the third sub-pixel driving circuit SPC3, only the detection line SL is provided, and the detection line SL is far away from the first power line VDDL, the second power line VSSL, and the data line DL, thereby eliminating or reducing signal crosstalk as much as possible.

Figure 11:
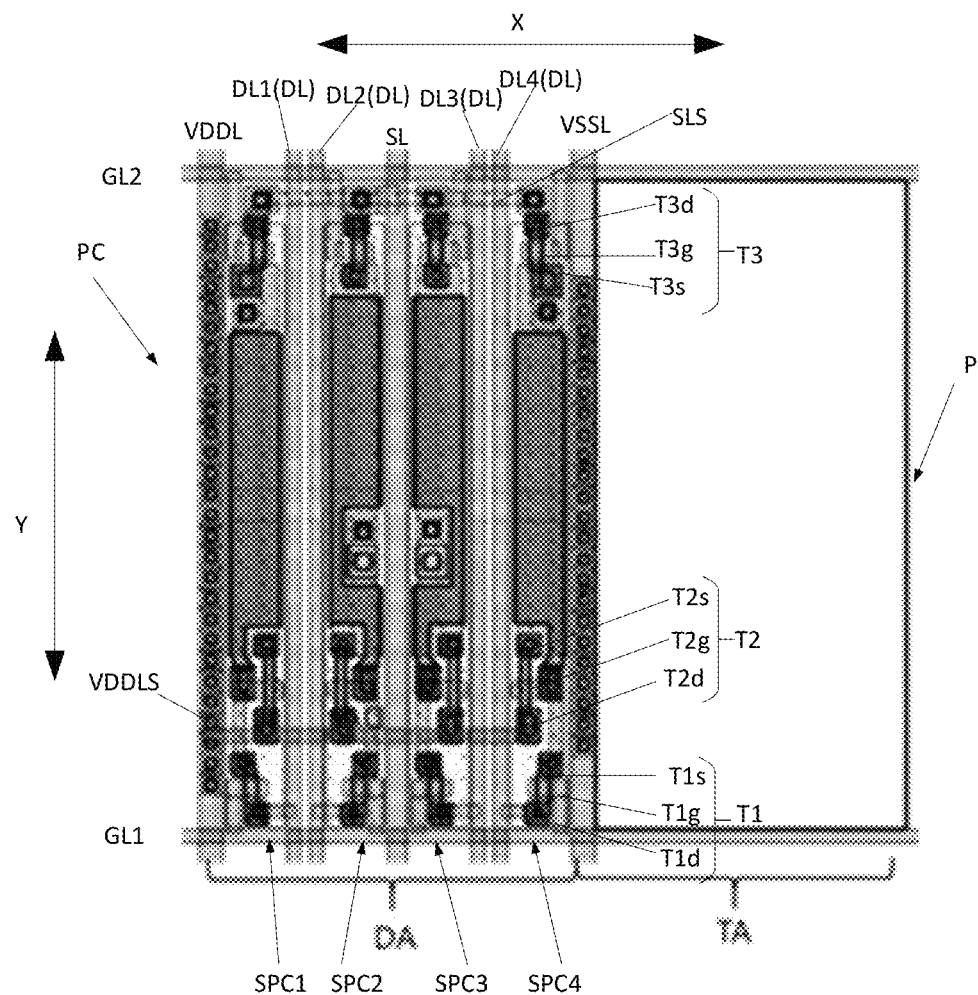
FIG. 11 is a schematic plan view of a single pixel according to some embodiments of the present disclosure.

FIG. 11 shows a plan view of a single pixel in FIG. 9. The structure of a single pixel in FIG. 11 is basically the same as that shown in FIG. 8. The similarities are not repeated here. The difference therebetween mainly lies in that the light transmission area TA is located on a side of the fourth sub-pixel driving circuit SPC4 away from the first sub-pixel driving circuit SPC1, the second sub-pixel driving circuit SPC2, and the third sub-pixel driving circuit SPC3, that is, the fourth sub-pixel driving circuit SPC4 is closer to the light transmission area TA than the first sub-pixel driving circuit SPC1, the second sub-pixel driving circuit SPC2 and the third sub-pixel driving circuit SPC3.

As shown in FIG. 11, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2, and the third data line DL3 and the fourth data line DL4 are arranged between the third sub-pixel driving circuit SPC3 and the fourth sub-pixel driving circuit SPC4. The first power line VDDL is located on a side of the first sub-pixel driving circuit SPC1 away from the first data line DL1. The second power line VSSL is located on a side of the fourth sub-pixel driving circuit SPC4 away from the fourth data line DL4. In the single pixel P, the fourth sub-pixel driving circuit SPC4 is closer to the light transmission area TA than the first sub-pixel driving circuit SPC1, the second sub-pixel driving circuit SPC2, and the third sub-pixel driving circuit SPC3. The second power line VSSL is located between the light transmission area TA and the fourth sub-pixel driving circuit SPC4, and the first power line VDDL is located on a side of the first sub-pixel driving circuit SPC1 away from the light transmission area TA.

In the embodiments, when the pixel driving circuit of the pixel P works, the first power line VDDL always maintains a VDD voltage signal, that is, a high voltage signal, and the second power line VSSL always maintains a VSS voltage signal, that is, a low voltage signal. The detection line SL may transmit a pulse of the reset signal, and may transmit a pulse of the detection signal. Between the second sub-pixel driving circuit SPC2 and the third sub-pixel driving circuit SPC3, only the detection line SL is provided, and the detection line SL is located away from the first power line VDDL, the second power line VSSL, and the data line DL, thereby eliminating or reducing signal crosstalk as much as possible.

Figure 12:
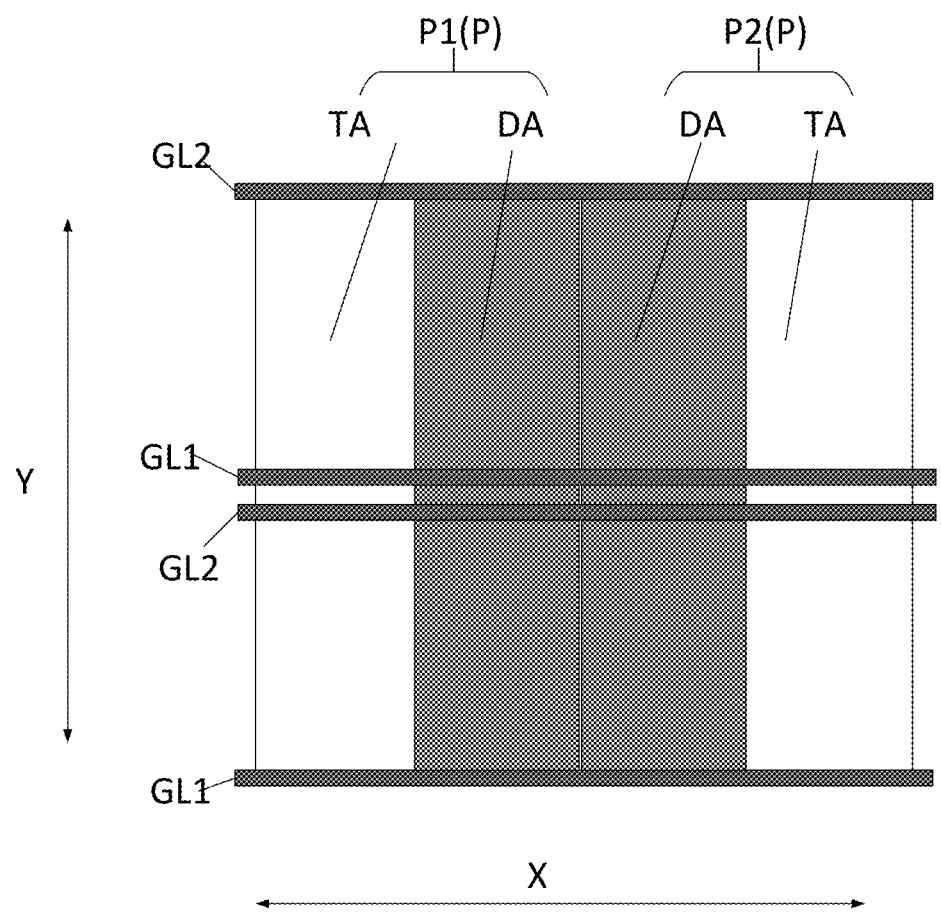
FIG. 12 is an enlarged schematic view of area A in FIG. 1.

FIG. 12 is an enlarged schematic view of the area A in FIG. 1, and only four pixels P are shown in FIG. 12. As shown in FIG. 12, each pixel P includes a light transmission area TA and a display area DA. In each pixel P, the light transmission area TA and the display area DA are arranged side by side in the first direction. As shown in FIG. 12, in each pixel P, the light transmission area TA and the display area DA are arranged left and right. In the first direction X, a first pixel P1 and a second pixel P2 located adjacent to each other are arranged, and the display area DA of the first pixel P1 is adjacent to the display area DA of the second pixel P2. In the first pixel P1, the light transmission area TA is located on the left side of the display area DA, and the pixel structure in FIG. 7 or FIG. 8 may be adopted. In the second pixel P2, the light transmission area TA is located on the right side of the display area DA, and the pixel structure in FIG. 10 or FIG. 11 may be adopted.

Figure 13:
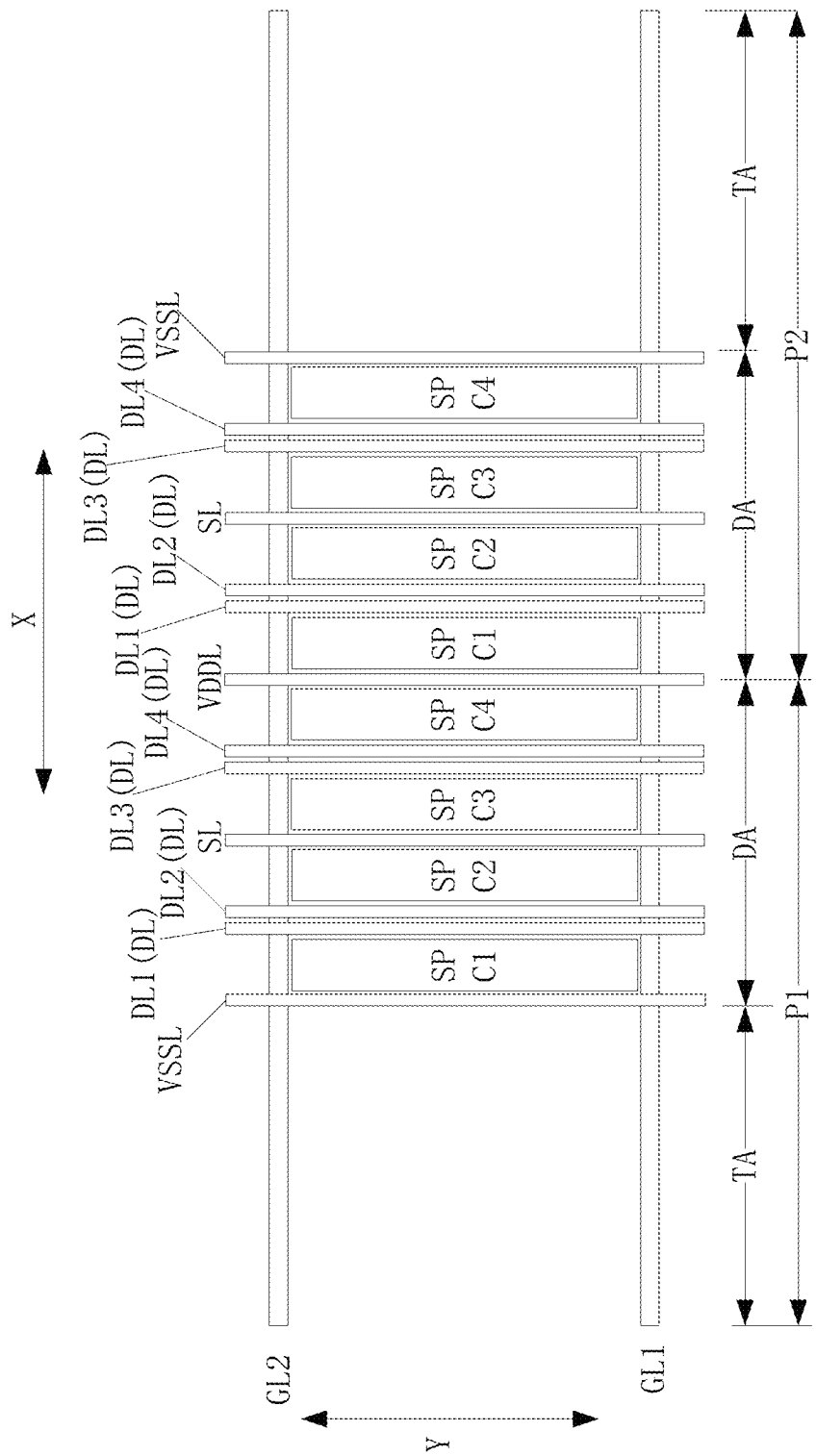
FIG. 13 is a schematic plan view of two adjacent pixels according to some embodiments of the present disclosure.

When the pixel structure shown in FIG. 7 is introduced to the first pixel P1 and the pixel structure shown in FIG. 11 is introduced to the second pixel P2, the first pixel P1 and the second pixel P2 may share a first power line VDDL, as shown in FIG. 13.

Figure 14:
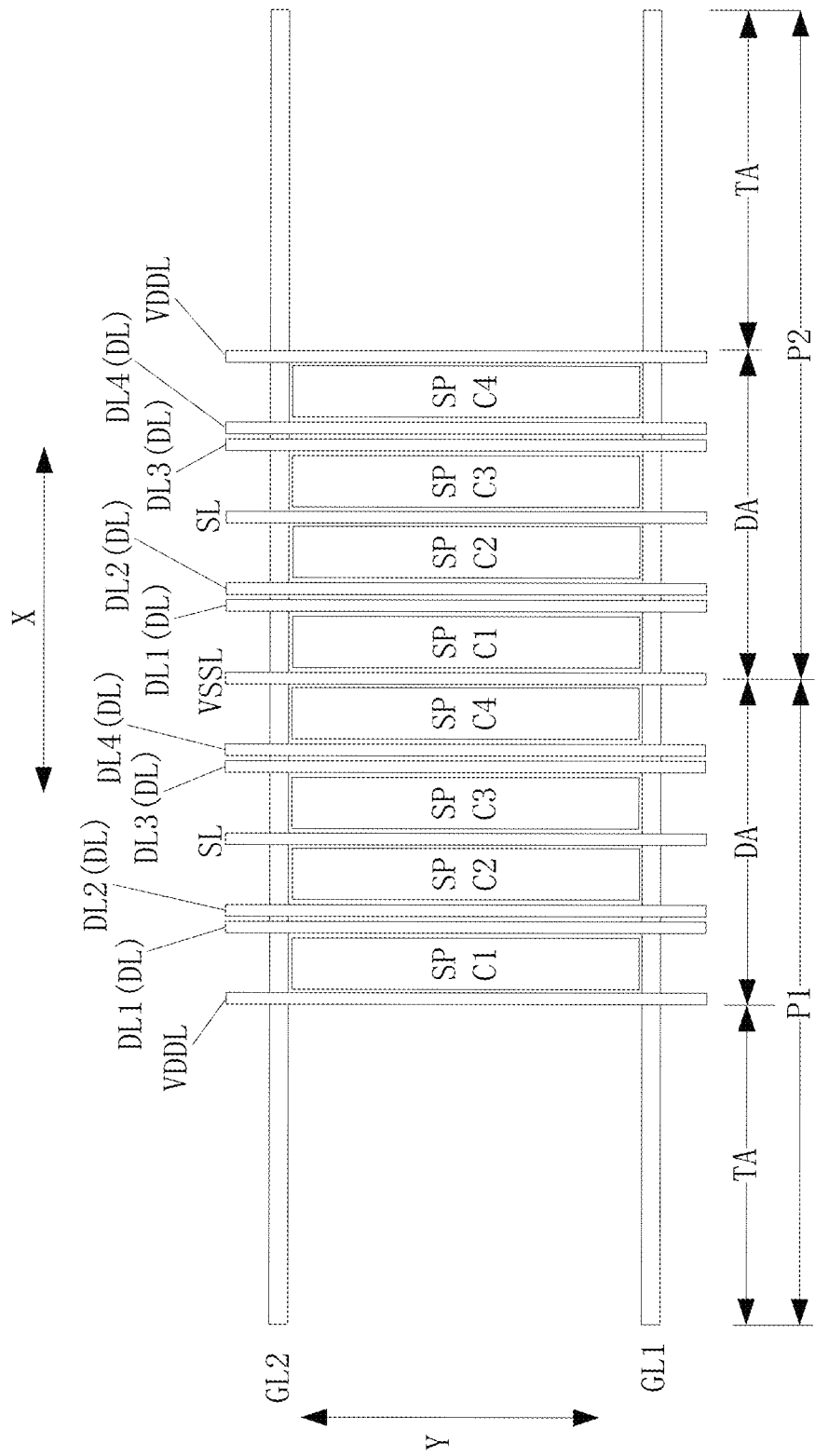
FIG. 14 is a schematic plan view of two adjacent pixels according to some embodiments of the present disclosure.

When the pixel structure shown in FIG. 8 is introduced to the first pixel P1 and the pixel structure shown in FIG. 10 is introduced to the second pixel P2, the first pixel P1 and the second pixel P2 may share a second power line VSSL, as shown in FIG. 14.

In the following embodiments, the pixel structure shown in FIG. 7 is taken as an example, and a single pixel structure and a pixel driving circuit of the single pixel in a transparent display panel are described in detail.

Figure 15:
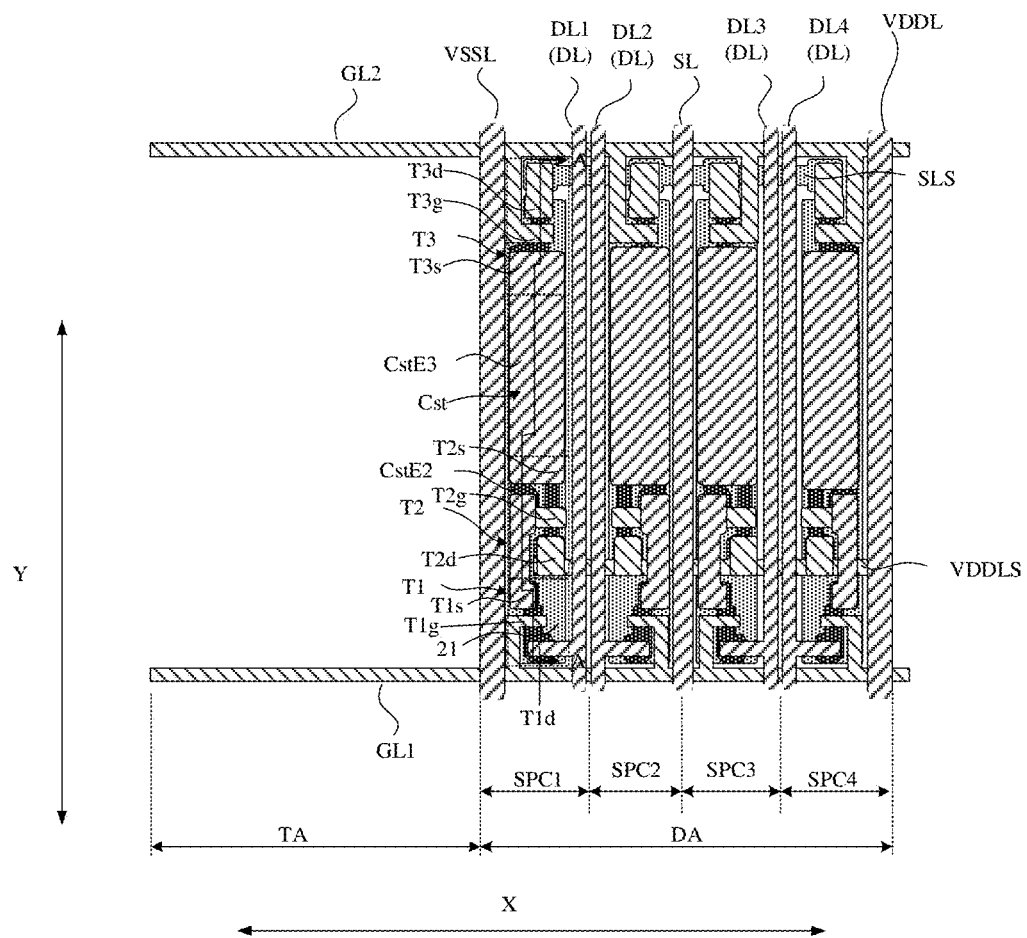
FIG. 15 is a schematic plan view of a single pixel of a transparent display panel according to some embodiments of the present disclosure.

FIG. 15 shows a schematic plan view of a display area of a single pixel according to some embodiments of the present disclosure. FIG. 15 may be considered as a more detailed structural view of the pixel structure shown in FIG. 7. As shown in FIG. 15, the display area DA of the pixel P includes four sub-pixels, namely, the first sub-pixel, the second sub-pixel, the third sub-pixel and the fourth sub-pixel. The four sub-pixels may be a red sub-pixel, a green sub-pixel, a blue sub-pixel, and a white sub-pixel, respectively. Those skilled in the art should understand that each sub-pixel includes a sub-pixel driving circuit and a light-emitting element D located on the sub-pixel driving circuit. The light-emitting elements of the four sub-pixels may be adjusted in shape and arrangement according to actual needs, as long as that the sub-pixel driving circuit of each sub-pixel may drive its corresponding light-emitting element D is ensured. In the art, the pixel defining layer is used to define a position and a shape of the light-emitting area of the light-emitting element. The luminescent material layer of the light-emitting element is arranged in the opening of the pixel defining layer. A position and a shape of the opening of the pixel defining layer may be adjusted according to actual needs, so as to adjust the position and shape of the luminescent material layer of the organic light-emitting element.

In order to clearly reflect the structure and position relationship of each sub-pixel, the light-emitting element of each sub-pixel and the pixel defining layer surrounding each light-emitting element are not shown in FIG. 15. It mainly shows sub-pixel driving circuits of the first sub-pixel, the second sub-pixel, the third sub-pixel, and the fourth sub-pixel, namely a first sub-pixel driving circuit SPC1, a second sub-pixel driving circuit SPC2, a third sub-pixel driving circuit SPC3 and a fourth sub-pixel driving circuit SPC4. As shown in FIG. 15, all of the first sub-pixel driving circuit SPC1, the second sub-pixel driving circuit SPC2, the third sub-pixel driving circuit SPC3, and the fourth sub-pixel driving circuit SPC4 extend in the second direction Y, and are arranged side by side in the first direction X in the pixel P. The first sub-pixel driving circuit SPC1, the second sub-pixel driving circuit SPC2, the third sub-pixel driving circuit SPC3, and the fourth sub-pixel driving circuit SPC4 constitutes the pixel driving circuit of the pixel P. Therefore, FIG. 4 may also be taken as a schematic structural view of a pixel driving circuit of a single pixel according to some embodiments of the present disclosure. In the embodiments, the first sub-pixel driving circuit SPC1, the second sub-pixel driving circuit SPC2, the third sub-pixel driving circuit SPC3, and the fourth sub-pixel driving circuit SPC4 are arranged away from the light transmission area TA of the pixel P in sequence.

In the embodiments, a pixel structure including four sub-pixels is used as an example. Those skilled in the art may understand that in other embodiments, a single pixel may have other numbers of sub-pixels, for example, three sub-pixels, namely, a red sub-pixel, a green sub-pixel and a blue sub-pixel.

FIG. 5 is a circuit diagram of a single sub-pixel according to some embodiments of the present disclosure. The single pixel P in the embodiments of the present disclosure will be explained below with reference to FIG. 15 and FIG. 5.

As shown in FIG. 15, each pixel P corresponds to one first gate line GL1, one second gate line GL2, one first power line VDDL, one second power line VSSL, one detection line SL, and four data lines DL. As shown in FIG. 5, each of the first sub-pixel driving circuit SPC1, the second sub-pixel driving circuit SPC2, the third sub-pixel driving circuit SPC3, and the fourth sub-pixel driving circuit SPC4 includes a first transistor T1 (also referred to as a switching transistor T1), a second transistor T2 (also referred to as a driving transistor T2), a third transistor T3 (also referred to as a detection transistor T1), and a storage capacitor Cst. The first gate line GL1 provides a first control signal G1 for each sub-pixel driving circuit. The second gate line GL2 provides a second control signal G2 for each sub-pixel driving circuit. The first data line DL1, the second data line DL2, the third data line DL3 and the fourth data line DL4 provide data signals Data for the first sub-pixel driving circuit SPC1, the second sub-pixel driving circuit SPC2, the third sub-pixel driving circuit SPC3, and the fourth sub-pixel driving circuit SPC4, respectively. The first power line VDDL provide a constant first voltage signal, such as a VDD voltage signal, for each sub-pixel driving circuit. The second power line VSSL provides a constant second voltage signal, such as a VSS voltage signal, for each sub-pixel driving circuit. The detection line SL is used to provide a reset signal to each pixel driving circuit, and is used to sample and detect electrical characteristics of each sub-pixel driving circuit, for example, a threshold voltage of the second transistor T2, so as to achieve external compensation and obtain a better display effect.

Specifically, each sub-pixel driving circuit includes a switching transistor T1, a driving transistor T2, a detection transistor T3, and a storage capacitor Cst. The driving transistor T2 is the driving transistor DT in FIG. 3. A gate of the switching transistor T1 receives the first control signal G1 provided by the first gate line GL1. A first electrode of the switching transistor T1, for example, a drain, receives the data signal Data provided by the data line DL. A second electrode of the switching transistor T1, for example, a source, is electrically coupled to a second capacitor electrode CstE2 of the storage capacitor Cst and a gate of the driving transistor T2, and the three are electrically coupled at a first node G. The switching transistor T1 is configured to write the data signal Data into the gate of the driving transistor T2 and the storage capacitor Cst in response to the first control signal G1.

The first electrode of the driving transistor T2, for example, a drain, is electrically coupled to the first power line VDDL through a first power connection line VDDLS, and receives the first voltage signal provided by the first power line VDDL, for example, the VDD voltage signal. A second electrode of the transistor T2, for example, a source, is electrically coupled to a second capacitor electrode CstE2 of the storage capacitor Cst, and is configured to be electrically coupled to the anode of the light-emitting element D. The driving transistor T2 is configured to control the current used to drive the light-emitting element D under the control of the voltage of the gate of the driving transistor T2.

The gate of the detection transistor T3 receives the second control signal G2 provided by the second gate line GL2. A first electrode of the detection transistor T3, for example, a source, is electrically coupled to the second electrode of the driving transistor T2 and the first capacitor electrode CstE1 of the storage capacitor Cst, and the three are electrically coupled at a second node S. A second electrode of the detection transistor T3, for example, a drain, is electrically coupled to the detection line SL through the detection connection line SLS. obtaining the reset signal from the detection line SL and provides a sampling detection signal SEN to the detection line SL. The detection transistor T3 is configured to detect the electrical characteristics of the sub-pixel driving circuit to which it belongs in response to the second control signal G2, to achieve external compensation. The electrical characteristics include, for example, the threshold voltage and/or carrier mobility of the switching transistor T1, or the threshold voltage and driving current of the light-emitting element.

The anode of the light-emitting element D is electrically coupled to the second electrode of the driving transistor T2, for example, the source. The cathode of the light-emitting element D is electrically coupled to the second power line VSSL, for example, through a via hole, to receive a VSS voltage signal. The light-emitting element D emits light based on the current flowing through it, and the luminous intensity is determined by the intensity of the current flowing through the light-emitting element D.

In some embodiments, the storage capacitor Cst may include a third capacitor electrode CstE3 electrically coupled to the first capacitor electrode CstE1. The first capacitor electrode CstE1, the second capacitor electrode CstE2, and the third capacitor electrode CstE3 are sequentially stacked on the base substrate 10. The first capacitor electrode CstE1 and the second capacitor electrode CstE2 have an overlapping area, and the first capacitor electrode CstE1 and the second capacitor electrode CstE2 constitute a first capacitor. The third capacitor electrode CstE3 and the second capacitor electrode CstE2 have an overlapping area, and the third capacitor electrode CstE3 and the second capacitor electrode CstE2 constitute a second capacitor. The storage capacitor Cst may be regarded as a parallel connection of the first capacitor and the second capacitor, thereby increasing the capacitance of the storage capacitor Cst.

As shown in FIG. 15, in an area corresponding to the single pixel P, that is, between both ends of the single pixel in the first direction X, both the first gate line GL1 and the second gate line GL2 extend in the first direction X, for example, in a linear shape. The first gate line GL1 and the second gate line GL2 are respectively arranged on both sides of the light transmission area TA, that is, the light transmission area TA is sandwiched between the first gate line GL1 and the second gate line GL2. In other embodiments, the first gate line GL1 and the second gate line GL2 may also pass through the light transmission area TA. In the area corresponding to the single pixel P, that is, in a range shown in FIG. 15, all of the first power line VDDL, the second power line VSSL, the detection line SL and the four data lines DL extend in the second direction Y, for example, in a linear shape. Specifically, the detection line SL is located between the second sub-pixel driving circuit SPC2 and the third sub-pixel driving circuit SPC3. The first data line DL1 and the second data line DL2 are arranged between the first sub-pixel driving circuit SPC1 and the second sub-pixel driving circuit SPC2. The first data line DL1 is closer to the first sub-pixel driving circuit SPC1 than the second data line DL2, and the second data line DL2 is closer to the second sub-pixel driving circuit SPC2 than the first data line DL1. That is, the first data line DL1 is located between the first sub-pixel driving circuit SPC1 and the second data line DL2, and the second data line DL2 is located between the first data line DL1 and the second sub-pixel driving circuit SPC2. The third data line DL3 and the fourth data line DL4 are arranged between the third sub-pixel driving circuit SPC3 and the fourth sub-pixel driving circuit SPC4. The third data line DL3 is closer to the third sub-pixel driving circuit SPC3 than the fourth data line DL4, and the fourth data line DL4 is closer to the fourth sub-pixel driving circuit SPC4 than the third data line DL3. That is, the third data line DL3 is located between the third sub-pixel driving circuit SPC3 and the fourth data line DL4, and the fourth data line DL4 is located between the third data line DL3 and the fourth sub-pixel driving circuit SPC4. The second power line VSSL is located on a side of the first sub-pixel driving circuit SPC1 away from the first data line DL1, that is, located between the light transmission area TA and the first sub-pixel driving circuit SPC1. The first power line VDDL is located on a side of the fourth sub-pixel driving circuit SPC4 away from the fourth data line DL4. In the embodiments, the structure of the first sub-pixel driving circuit SPC1 and the structure of the fourth sub-pixel driving circuit SPC4 are approximately mirror-symmetrical relative to the position of the detection line SL, and the structure of the second sub-pixel driving circuit SPC2 and the structure of the third sub-pixel driving circuit SPC3 are approximately mirror-symmetrical relative to the position of the detection line SL.

It should be noted that "mirror-symmetrical" in the present disclosure means that the position relationship, such as a left-right position relationship, of each structure is approximately symmetrical. For example, for two sub-pixel structures which are approximately mirror-symmetrical, in one sub-pixel, an A structure is on the left of a B structure, and in another sub-pixel, the A structure is on the right of the B structure. For example, the "mirror-symmetrical" may also mean that the shape, size or orientation of each structure is approximately symmetrical relative to a certain straight line (for example, a row direction line or a column direction line). For example, for two sub-pixel structures which are approximately mirror-symmetrical, in one sub-pixel, the A structure protrudes towards the left, and in another sub-pixel, this corresponding A' structure protrudes towards the right. The corresponding A' structure may be a pattern located in the same layer as the A structure and has the same function as the A structure.

FIGS. 15 to 30 are schematic views of the process of preparing the display panel according to some embodiments of the disclosure, showing the structure of one pixel P of the transparent display panel. In the embodiments, that the transparent display panel is a top-emission OLED display panel is taken as an example for description. A single pixel P includes a display area DA and a light transmission area TA. A first sub-pixel driving circuit SPC1, a second sub-pixel driving circuit SPC2, a third sub-pixel driving circuit SPC3 and a fourth sub-pixel driving circuit SPC4 are sequentially arranged away from the light transmission area TA in the display area DA. The pixel driving circuit of each sub-pixel includes a first transistor T1, a second transistor T2, a third transistor T3 and a storage capacitor Cst.

Figure 16:
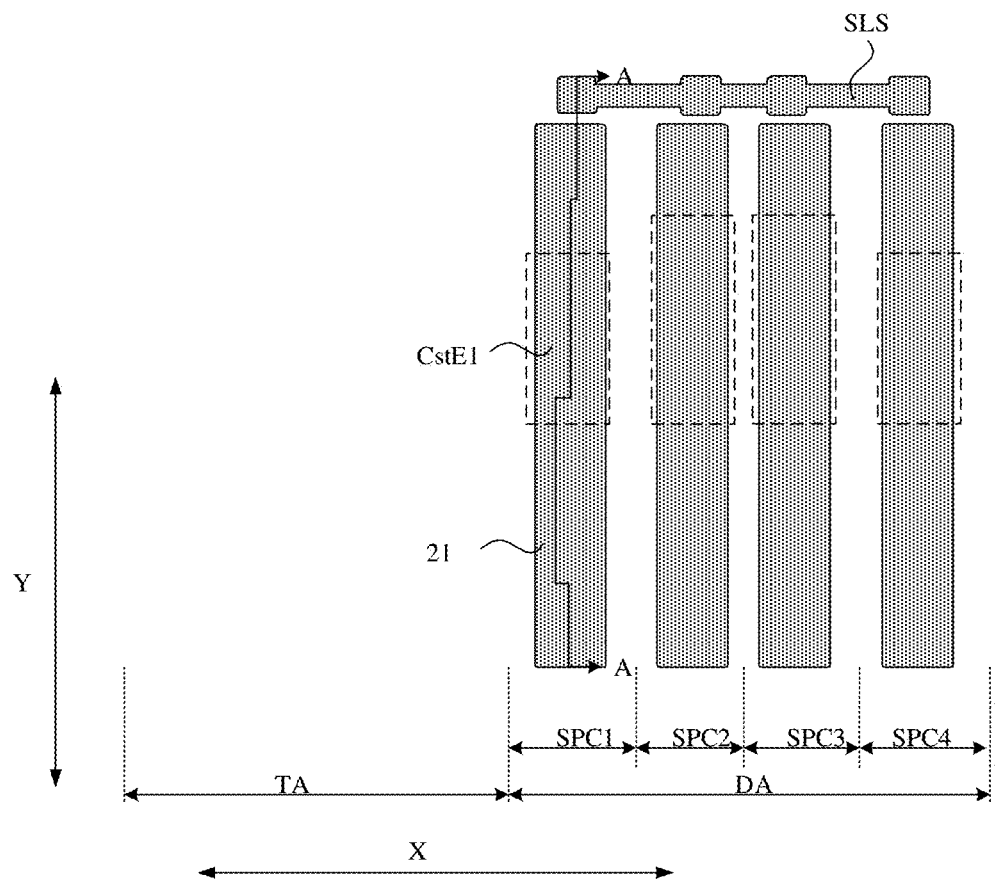
FIG. 16 is a schematic plan view of a single pixel after a pattern of a first metal layer is formed in a manufacturing process of a transparent display panel according to some embodiments of the present disclosure.
Figure 17:
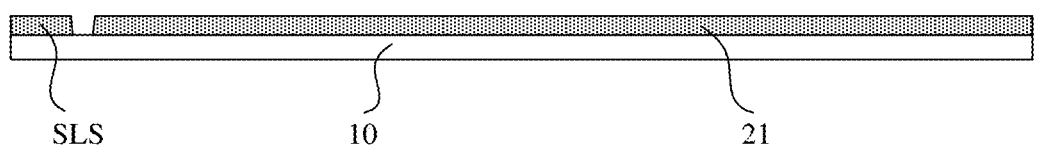
FIG. 17 is a schematic cross-sectional view along line A-A in FIG. 16.

FIG. 16 is a schematic plan view of a single pixel after a pattern of a first metal layer is formed in a manufacturing process of a transparent display panel according to some embodiments of the present disclosure, and FIG. 17 is a schematic cross-sectional view along line A-A in FIG. 16 (It should be noted that a cutting position indicated by line A-A in FIG. 16 is consistent with the cutting position indicated by the line A-A in other subsequent drawings). As shown in FIGS. 16 and 17, a pattern of the first metal layer 20 is firstly formed on the base substrate. Specifically, a first metal film is deposited on the base substrate 10, and the first metal film is patterned through a patterning process to form the pattern of the first metal layer 20 on the base substrate 10. The pattern of the first metal layer 20 includes a shielding layer 21 and a detection connection line SLS. Each sub-pixel driving circuit includes a shielding layer 21, and the detection connection line SLS is a strip-shaped structure extending in the first direction X and across four sub-pixel driving circuits. The detection connection line SLS is configured to be coupled to the detection line SL formed subsequently, so that the detection line SL provides a reset signal to each sub-pixel driving circuit, and is used for sampling and detecting electrical characteristics of each sub-pixel driving circuit. For example, the threshold voltage of the second transistor T2 is sampled, so as to achieve an external compensation. In some embodiments, the shielding layer 21 is in a shape of an elongated rectangle and extends in the second direction Y. The shielding layer 21 is configured to perform a light-shielding treatment on the channel of each transistor formed subsequently, so as to reduce light intensity irradiated on the transistors, and reduce leakage current, thereby reducing the influence of light on the characteristics of the transistors. At least a middle part of the shielding layer 21 (encircled by a dashed frame) serves as a capacitor electrode of the first capacitor, namely the first capacitor electrode CstE1, which is configured to form a first capacitor together with the second capacitor electrode CstE2 formed subsequently. In the second direction Y, the length of the shielding layer 21 is longer than a distance between the gate of the switching transistor T1 and the gate of the detection transistor T3 formed subsequently. In some embodiments, the length of the shielding layer 21 is longer than a distance between the drain of the switching transistor T1 and the drain of the third transistor T3 formed subsequently. As shown in FIGS. 15 and 16, the pattern of the first metal layer 20 in the first sub-pixel driving circuit SPC1 and the pattern of the first metal layer 20 in the fourth sub-pixel driving circuit SPC4 are mirror-symmetrical relative to the detection line SL formed subsequently. The pattern of the first metal layer 20 in the second sub-pixel driving circuit SPC2 and the pattern of the first metal layer 20 in the third sub-pixel driving circuit SPC3 are approximately mirror-symmetrical relative to the position of the detection line SL subsequently formed. After this patterning process, the shielding layer 21 and the detection connection line SLS are formed in the display area DA, and the first metal layer is not provided in the light transmission area TA.

Figure 18:
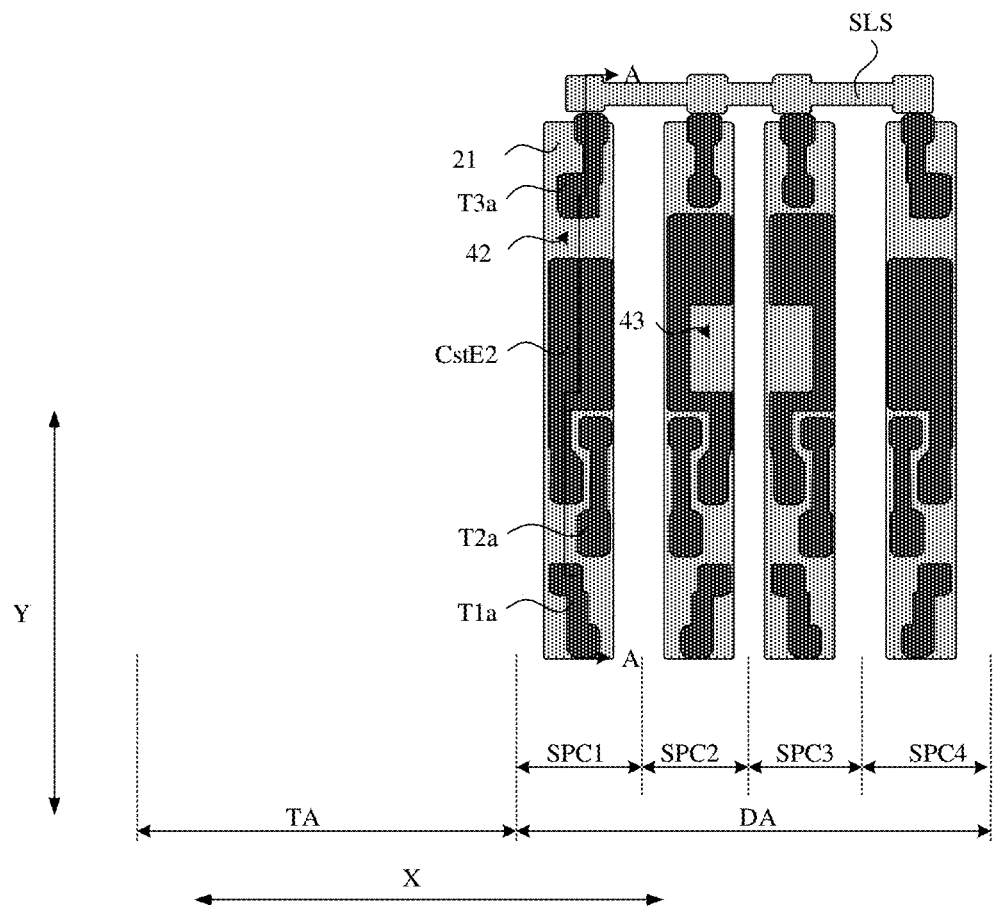
FIG. 18 is a schematic plan view of a single pixel after a pattern of an active material layer is formed in a manufacturing process of a transparent display panel according to some embodiments of the present disclosure.
Figure 19:
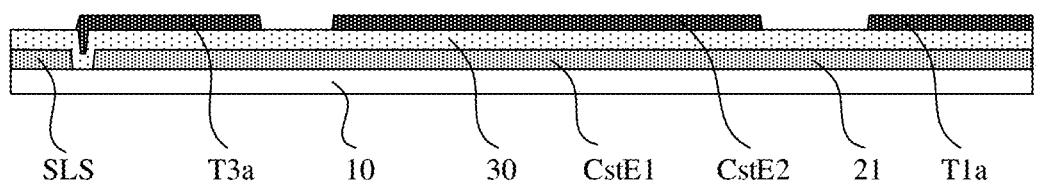
FIG. 19 is a schematic cross-sectional view along line A-A in FIG. 18.

FIG. 18 is a schematic plan view of a single pixel after a pattern of an active material layer is formed in the manufacturing process of a transparent display panel according to some embodiments of the present disclosure, and FIG. 19 is a schematic cross-sectional view along the line A-A in FIG. 18. As shown in FIGS. 18 and 19, a pattern of the active material layer 40 is then formed. Specifically, a first insulating film and an active material film are sequentially deposited on the base substrate 10 on which aforementioned patterns have been formed, the active material film is for example, a metal oxide film. The active material film is patterned through a patterning process to form a first insulating layer 30 covering the pattern of the first metal layer 20, and a pattern of the active material layer 40 formed on the first insulating layer 30. The active material layer 40 includes following structures provided in each sub-pixel driving circuit: an active layer of the switching transistor T1 (also referred to as a first active layer T1a), an active layer of the driving transistor T2 (also referred to as a second active layer T2a), an active layer of the detection transistor T3 (also referred to as a third active layer T3a) and the second capacitor electrode CstE2. An orthographic projection of the second capacitor electrode CstE2 on the base substrate 10 and an orthographic projection of the first capacitor electrode CstE1 on the base substrate 10 have an overlapping area, and the first capacitor electrode CstE1 and the second capacitor electrode CstE2 form the first capacitor.

In some embodiments, orthographic projections of the first active layer T1a, the second active layer T2a, and the third active layer T3a on the base substrate 10 and an orthographic projection of the shielding layer 21 on the base substrate 10 have an overlapped area, so that the shielding layer 21 may shield the channel regions of the switching transistor T1, the driving transistor T2 and the detection transistor T3 to prevent light from affecting the channel, and to avoid affecting display effect due to generation of photo-generated leakage current in the channel. Any two of the first active layer T1a, the second active layer T2a, the third active layer T3a, and the second capacitor electrode CstE2 are arranged at intervals. That is, the orthographic projection of the first active layer T1a on the base substrate 10, the orthographic projection of the second active layer T2a on the base substrate 10, the orthographic projection of the third active layer T3a on the base substrate 10, and the orthographic projection of the second capacitor electrode CstE2 on the base substrate 10 do not overlap each other, which is beneficial to design a width-to-length ratio of the channel of the switching transistor T1, the driving transistor T2 and the detection transistor T3 according to related requirements. In some embodiments, as shown in FIGS. 18 and 19, in the first sub-pixel driving circuit SPC1 and the fourth sub-pixel driving circuit SPC4, a spacer region 42 is provided between the second capacitor electrode CstE2 and the third active layer T3a. There is also an interval between the second capacitor electrode CstE2 and the third active layer T3a in the second sub-pixel driving circuit SPC2 and the third sub-pixel driving circuit SPC3. As shown in FIG. 18, the spacer region 42 in the first sub-pixel driving circuit SPC1 and the fourth sub-pixel driving circuit SPC4 is larger than the interval in the second sub-pixel driving circuit SPC2 and the third sub-pixel driving circuit SPC3, so as to facilitate a subsequent formation of via holes in the spacer region 42 in the first sub-pixel driving circuit SPC1 and the fourth sub-pixel driving circuit SPC4. A notch region 43 is provided in the middle of the second capacitor electrode CstE2 in the second sub-pixel driving circuit SPC2 and the third sub-pixel driving circuit SPC3. There is no active material layer 40 in the spacer region 42 and the notch region 43. In some embodiments, as shown in FIGS. 15 and 18, the pattern of the active material layer 40 in the first sub-pixel driving circuit SPC1 and the pattern of the active material layer 40 in the fourth sub-pixel driving circuit SPC4 are approximately mirror-symmetrical relative to the position of the detection line SL formed subsequently, and the pattern of the active material layer 40 in the second sub-pixel driving circuit SPC2 and the pattern of the active material layer 40 in the third sub-pixel driving circuit SPC3 are approximately mirror-symmetrical relative to the position of the detection line SL formed subsequently. After this patterning process, the pattern of the active material layer 40 is formed in the display area DA but not in the light transmission area TA.

The light transmission area TA includes the base substrate 10 and the first insulating layer 30 provided on the base substrate 10.

Figure 20:
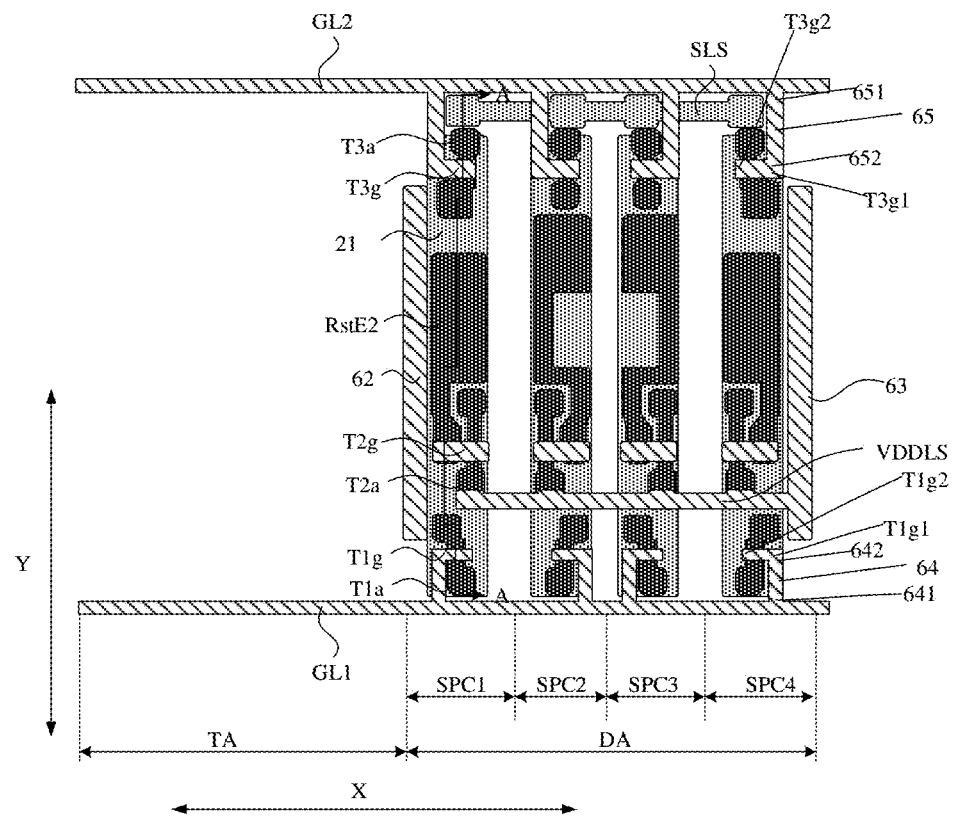
FIG. 20 is a schematic plan view of a single pixel after a pattern of a second metal layer is formed in a manufacturing process of a transparent display panel according to some embodiments of the present disclosure.
Figure 21:
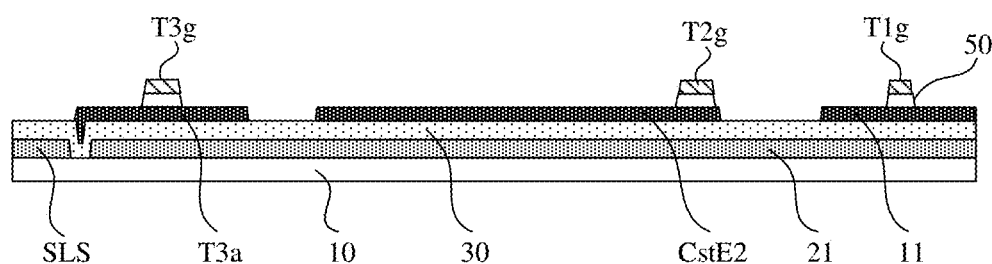
FIG. 21 is a schematic cross-sectional view along line A-A in FIG. 20.

FIG. 20 is a schematic plan view of a single pixel after a pattern of a second metal layer is formed in the manufacturing process of a transparent display panel according to some embodiments of the present disclosure, and FIG. 21 is a schematic cross-sectional view along the line A-A in FIG. 20. As shown in FIGS. 20 and 21, a pattern of the second metal layer 60 is then formed. Specifically, a second insulating film and a second metal film are sequentially deposited on the base substrate 10 on which aforementioned patterns have been formed, and a patterning process is performed on the second insulating film and the second metal film to form a pattern of the second insulating layer 50 and a pattern of the second metal layer 60 provided on the second insulating layer 50. In some embodiments, the pattern of the second insulating layer 50 and the pattern of the second metal layer 60 are formed by using the same mask, and they have the same pattern. The pattern of the second metal layer 60 includes a first gate line GL1, a second gate line GL2, a first power connection line VDDLS, a first auxiliary line 62, and a second auxiliary line 63 corresponding to each pixel P, and a gate of the switching transistor T1 (also referred to as a first gate T1g), a gate of the driving transistor T2 (also referred to as a second gate T2g) and a gate of the detection transistor T3 (also referred to as a third gate T3g) formed in each sub-pixel driving circuit. The pattern of the second metal layer 60 also includes a first gate connection line 64 and a second gate connection line 65 formed in each sub-pixel driving circuit. As shown in FIG. 20, in the region corresponding to the single pixel P, that is, in the region shown in FIG. 20, the first gate line GL1 and the second gate line GL2 are arranged in parallel, and both extend in line in the first direction X. The first gate line GL1 is located on the lower side of the light transmission area TA, and the second gate line GL2 is located on the upper side of the light transmission area TA. That is, the light transmission area TA is sandwiched between the first gate line GL1 and the second gate line GL2. Each sub-pixel driving circuit is also sandwiched between the first gate line GL1 and the second gate line GL2.

The first gate T1g extends in the first direction X, provided spanning the first active layer T1a, and is electrically coupled to the first gate line GL1 through the first gate connection line 64 extending in the second direction Y. Specifically, the first gate T1g includes a connection end T1g1 and a free end T1g2, and the first gate connection line 64 includes a first end 641 and a second end 642. The first end 641 of the first gate connection line 64 is electrically coupled to the first gate line GL1, and the second end 642 of the first gate connection line 64 is electrically coupled to the connection end T1g1 of the first gate T1g. In some embodiments, the first gate T1g, the first gate connection line 64, and the first gate line GL1 are an integral structure. The second gate T2g extends in the first direction X, provided spanning the second active layer T2a, and has an overlapping area with the second capacitor electrode CstE2. The third gate T3g extends in the first direction X, provided spanning the third active layer T3a, and is electrically coupled to the second gate line GL2 through the second gate connection line 65 extending in the second direction Y. Specifically, the third gate T3g includes a connection end T3g1 and a free end T3g2, and the second gate connection line 65 includes a first end 651 and a second end 652. The first end 651 of the second gate connection line 65 is electrically coupled to the second gate line GL2, and the second end 652 of the second gate connection line 65 is electrically coupled to the connection end T3g1 of the third gate T3g. In some embodiments, the third gate T3g, the second gate connection line 65 and the second gate line GL2 are an integral structure.

The first auxiliary line 62 is formed in an area where the second power line VSSL is located. The first auxiliary line 62 extends in the second direction Y, and is configured to be electrically coupled to the second power line VSSL formed subsequently. In this way, the second power line VSSL to be formed subsequently is provided in parallel with the first auxiliary line 62 through a via hole, thereby effectively reducing the impedance of the second power line VSSL. In some embodiments, in the second direction Y, the first auxiliary line 62 is located between the first gate T1g and the third gate T3g. Those skilled in the art should understand that the first auxiliary line 62 is not necessary, and in some embodiments, the first auxiliary line 62 may be omitted.

The second auxiliary line 63 is formed in an area where the first power line VDDL is located. The second auxiliary line 63 extends in the second direction Y, and is configured to be electrically coupled to the first power line VDDL formed subsequently. Therefore, the first power line VDDL to be formed subsequently is arranged in parallel with the second auxiliary line 63 through a via hole, thereby effectively reducing the impedance of the first power line VDDL. In some embodiments, in the second direction Y, the second auxiliary line 63 is located between the first gate T1g and the third gate T3g. Those skilled in the art should understand that the second auxiliary line 63 is not necessary, and in some embodiments, the second auxiliary line 63 may be omitted.

The first power connection line VDDLS extends in the first direction X, provided spanning the four sub-pixel driving circuits, and is configured to be electrically coupled to the first power line VDDL formed subsequently. In some embodiments, the first power connection line VDDLS may be electrically coupled to the second auxiliary line 63, and the two are, for example, an integral structure.

As shown in FIG. 21, the pattern of the second insulating layer 50 is the same as that of the second metal layer 60, that is, the second insulating layer 50 is located under the second metal layer 60, and in an area outside the second metal layer 60, there is no second insulating layer 50. As shown in FIG. 20, except the first power connection line VDDLS, the pattern of the second metal layer in the first sub-pixel driving circuit SPC1 and the pattern of the second metal layer in the fourth sub-pixel driving circuit SPC4 are approximately mirror-symmetrical relative to the position of the detection line SL formed subsequently, and the pattern of the second metal layer in the second sub-pixel driving circuit SPC2 and the pattern of the second metal layer in the third sub-pixel driving circuit SPC3 are approximately mirror-symmetrical relative to the position of the detection line SL formed subsequently.

In some embodiments, this process also includes a conductivity treatment. The conductivity treatment is to use the pattern of the second metal layer 60 including the first gate T1g, the second gate T2g and the third gate T3g as a shield to perform a plasma treatment after the pattern of the second metal layer 60 is formed. The active material layer 40 in the region shielded by the first gate T1g, the second gate T2g, and the third gate T3g (that is, overlapping areas of the active material layer 40 and the first gate T1g, the second gate T2g and the third gate T3g) respectively serve as the channel region of the transistor. The active material layer 40 in the region being not shielded by the second metal layer 60 is made conductive, forming a conductive second capacitor electrode CstE2 and a conductive source and drain region. After this patterning process, the pattern of the second metal layer 60 is formed in the display area DA but not in the light transmission area TA. The light transmission area TA includes the base substrate 10 and the first insulating layer 30 provided on the base substrate 10.

Figure 22:
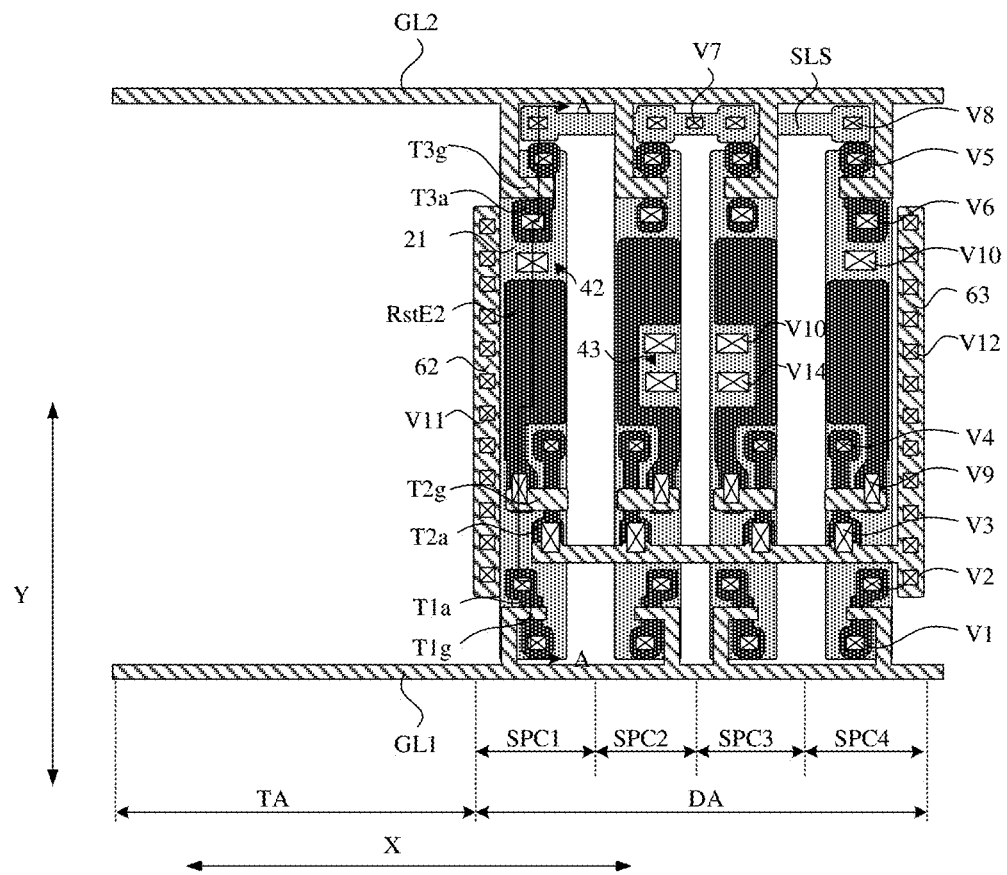
FIG. 22 is a schematic plan view of a single pixel after a pattern of a third insulating layer is formed in a manufacturing process of a transparent display panel according to some embodiments of the present disclosure.
Figure 23:
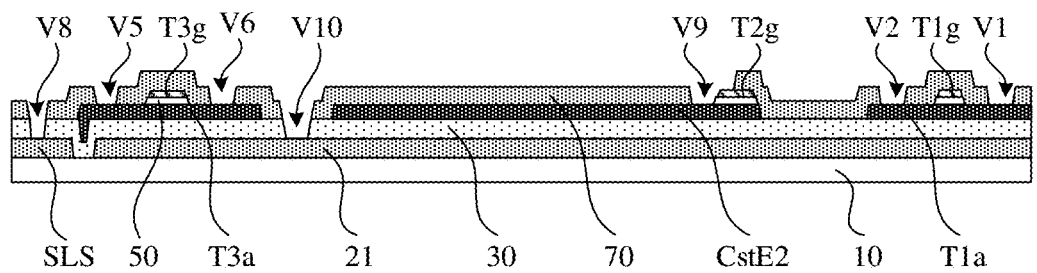
FIG. 23 is a schematic cross-sectional view along line A-A in FIG. 22.

FIG. 22 is a schematic plan view of a single pixel after a pattern of a third insulating layer is formed in the manufacturing process of the transparent display panel according to some embodiments of the present disclosure, and FIG. 23 is a schematic cross-sectional view along the line A-A in FIG. 22. As shown in FIGS. 22 and 23, a pattern of the third insulating layer 70 is then formed. Forming the pattern of the third insulating layer 70 includes: a third insulating film is deposited on the base substrate 10 on which aforementioned patterns have been formed, and the third insulating film is patterned through a patterning process to form the pattern of the third insulating layer 70 covering aforementioned structures. The third insulating layer 70 is provided with a plurality of via holes. The plurality of via holes include: a first via hole V1 and a second via hole V2 respectively located on both sides of the first gate T1g, a third via hole V3 and a fourth via hole V4 respectively located on both sides of the second gate T2g, a fifth via hole V5 and a sixth via hole V6 respectively located on both sides of the third gate T3g, a seventh via hole V7 located at an overlapping position of the detection connection line SLS and the detection line, an eighth via hole V8 located at an overlapping position of the detection connection line SLS and the drain of the detection transistor T3, a ninth via hole V9 located at a junction of the second gate T2g and the second capacitor electrode CstE2, a tenth via hole V10 and a fourteenth via hole V14 located at a location of the shielding layer 21 not being covered by the active material layer 40, such as the spacer region 42 or the notch region 43, a plurality of eleventh via holes V11 located at a location of the first auxiliary line 62 and a plurality of twelfth via holes V12 located at a location of the second auxiliary line 63.

The third insulating layer 70 in the first via hole V1 and the second via hole V2 is etched off, to expose surfaces at both ends of the first active layer T1a. The third via hole V3 is disposed at a junction of the first power connection line VDDLS and the second active layer T2a. The third insulating layer 70 in the third via hole V3 is etched off, so that a surface of the second active layer T2a and a surface of the first power connection line VDDLS are both exposed at the same time. The third insulating layer 70 in the fourth via hole V4 is etched off to expose the surface of a second active layer T2a. The third insulating layer 70 in the fifth via hole V5 and the sixth via hole V6 is etched off to expose the surfaces at both ends of the third active layer T3a. The seventh via hole V7 is located at the overlapping position of the detection connection line SLS and the detection line SL formed subsequently, and each sub-pixel driving circuit is provided with one eighth via hole V8. The first insulating layer 30 and the third insulating layer 70 in the seventh via hole V7 and the eighth via hole V8 are etched off to expose the surface of the detection connection line SLS. The ninth via hole V9 is located at the junction of the second gate T2g and the second capacitor electrode CstE2. The third insulating layer 70 in the ninth via hole V9 is etched off to expose the surface of the second gate T2g and the surface of the second capacitor electrode CstE2. In the first sub-pixel driving circuit SPC1 and the fourth sub-pixel driving circuit SPC4, an orthographic projection of the tenth via hole V10 on the base substrate 10 is located within an orthographic projection of the spacer region 42 located between the second capacitor electrode CstE2 and the third active layer T3a on the base substrate 10. In the second sub-pixel driving circuit SPC2 and the third sub-pixel driving circuit SPC3, an orthographic projection of the tenth via hole V10 on the base substrate is located within an orthographic projection of the notch region 43 located in the middle of the second capacitor electrode CstE2 on the base substrate 10. The first insulating layer 30 and the third insulating layer 70 in the tenth via hole V10 are etched off to expose the surface of the shielding layer 21.

The third insulating layer 70 in the fourteenth via hole V14 is etched off to expose the first insulating layer 30. The fourteenth via hole V14 is designed for process symmetry and is only formed in the second sub-pixel driving circuit SPC2 and the third sub-pixel driving circuit SPC3. An orthographic projection of the fourteenth via hole V14 on the base substrate 10 is located within the orthographic projection of the notch region 43 located in the middle of the second capacitor electrode CstE2 on the base substrate 10. The fourteenth via hole V14 is absent in the first sub-pixel driving circuit SPC1 and the fourth sub-pixel driving circuit SPC4. In the subsequent process, a thirteenth via hole V13 for connecting the anode is formed in each sub-pixel driving circuit. In the first sub-pixel driving circuit SPC1 and the fourth sub-pixel driving circuit SPC4, the thirteenth via hole V13 formed subsequently covers the sixth via hole V6 that only penetrates the third insulating layer 70 to form a combined hole. In the second sub-pixel driving circuit SPC2 and the third sub-pixel driving circuit SPC3, the thirteenth via hole V13 formed subsequently is located in the notch region 43 and close to the tenth via hole V10. For the process symmetry of the sub-pixel driving circuits, in the second sub-pixel driving circuit SPC2 and the third sub-pixel driving circuit SPC3, the fourteenth via hole V14 is disposed at the position of the thirteenth via hole V13, and the fourteenth via hole V14 is similar to the sixth via hole V6 in the first sub-pixel driving circuit SPC1 and the fourth sub-pixel driving circuit SPC4, so that the thirteenth via hole V13 formed subsequently cover the fourteenth via hole V14 to form a combined hole. The fourteenth via hole V14 is not necessary, and in some embodiments, the fourteenth via may not be provided.

The eleventh via holes V11 is located on the first auxiliary line 62, that is, orthographic projections of the plurality of eleventh via holes V11 on the base substrate 10 fall within the orthographic projection of the first auxiliary line 62 on the base substrate 10. The plurality of eleventh via holes V11 are arranged at intervals, and the third insulating layer 70 in the eleventh via holes V11 is etched off to expose the surface of the first auxiliary line 62.

The plurality of twelfth via holes V12 are located on the second auxiliary line 63, and orthographic projections of the plurality of twelfth via holes V12 on the base substrate 10 fall within the orthographic projection of the second auxiliary line 63 on the base substrate 10. The plurality of twelfth via holes V12 are arranged at intervals, and the third insulating layer 70 in the twelfth via holes V12 is etched off to expose the surface of the second auxiliary line 63. After this patterning process, multiple patterns of via holes are formed in the display area DA, and the light transmission area TA includes the first insulating layer 30 and the third insulating layer 70 stacked on the base substrate 10.

Figure 24:
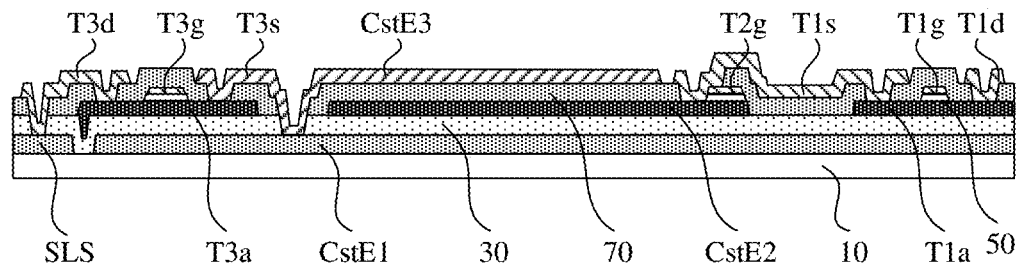
FIG. 24 is a schematic cross-sectional view along line A-A in FIG. 15.

FIG. 15 is a schematic plan view of a single pixel after a pattern of a third metal layer is formed in the manufacturing process of a transparent display panel according to some embodiments of the present disclosure, and FIG. 24 is a schematic cross-sectional view along line A-A in FIG. 15. As shown in FIGS. 15 and 24, the pattern of the third metal layer 80 is then formed. Specifically, a third metal film is deposited on the base substrate on which aforementioned patterns have been formed, and the third metal film is patterned through a patterning process to form the pattern of the third metal layer on the third insulating layer 70. The third metal layer 70 includes: a first power line VDDL, a second power line VSSL, a detection line SL, and four data lines DL corresponding to each pixel P, the source and the drain (also referred to as the first source T1s and the first drain T1d) of the switching transistor T1 formed in each sub-pixel, the source and the drain (also referred to as the second source T2s and the second drain T2d) of the driving transistor T2 formed in each sub-pixel, the source and the drain (also referred to as the third source T3s and the third drain T3d) of the detection transistor T3 formed in each sub-pixel, and the third capacitor electrode CstE3. FIG. 24 is a schematic cross-sectional view along the line AA in FIG. 11. As shown in FIGS. 15 and 24, the first drain T1d and the first source T1s are electrically coupled to conductive ends of the first active layer T1a on both sides of the first gate T1g through the first via hole V1 and the second via hole V2, respectively, so as to form the switching transistor T1. The second drain T2d and the second source T2s are electrically coupled to conductive ends of the second active layer T2a on both sides of the second gate T2g through the third via hole V3 and the fourth via hole V4, respectively, so as to form the driving transistor T2. At the same time, the second drain T2d is also electrically coupled to the first power connection line VDDLS through the third via hole V3. The third drain T3d and the third source T3s are electrically coupled to conductive ends of the third active layer T3a on both sides of the third gate T3g through the fifth via hole V5 and the sixth via hole V6, respectively, so as to form the detection transistor T3. In addition, the third drain T3d is also electrically coupled to the detection connection line SLS through the eighth via hole V8, and the detection line SL is electrically coupled to the detection connection line SLS through the seventh via hole, so that the detection line and the drain T3d of the detection transistor T3 of each sub-pixel driving circuit is electrically coupled. The first source T1s is also electrically coupled to the second gate T2g and the second capacitor electrode CstE2 through the ninth via hole V9, and the ninth via hole V9 may be regarded as the first node G in FIG. 5. The third capacitor electrode CstE3 is electrically coupled to the shielding layer 21 through the tenth via hole V10, and fills the fourteenth via hole V14. The third capacitor electrode CstE3 is electrically coupled to the second source T2s and the third source T3s, and they may be an integral structure. The second power line VSSL is electrically coupled to the first auxiliary line 62 through the plurality of eleventh via holes V11 to reduce the transmission resistance of the second power line VSSL. The first power line VDDL is electrically coupled to the second auxiliary line 63 through the plurality of twelfth via holes V12 to reduce the transmission resistance of the first power line VDDL, and the VDD voltage signal is transmitted to the second drain T2d of the driving transistor T2 through the second auxiliary line 63 and the first power connection line VDDLS. As shown in FIG. 15, the pattern of the third metal layer 80 in the first sub-pixel driving circuit SPC1 and the pattern of the third metal layer 80 in the fourth sub-pixel driving circuit SPC4 are approximately mirror-symmetrical relative to the position of the detection line SL being formed, the pattern of the third metal layer 80 in the second sub-pixel driving circuit SPC2 and the pattern of the third metal layer 80 in the third sub-pixel driving circuit SPC3 are approximately mirror-symmetrical relative to the position of the detection line SL being formed.

After this patterning process, the pattern of the third metal layer 80 is formed in the display area DA but not in the light transmission area TA. The light transmission area TA includes the base substrate 10 and the first insulating layer 30 and third insulating layer 70 provided on the base substrate 10.

Figure 25:
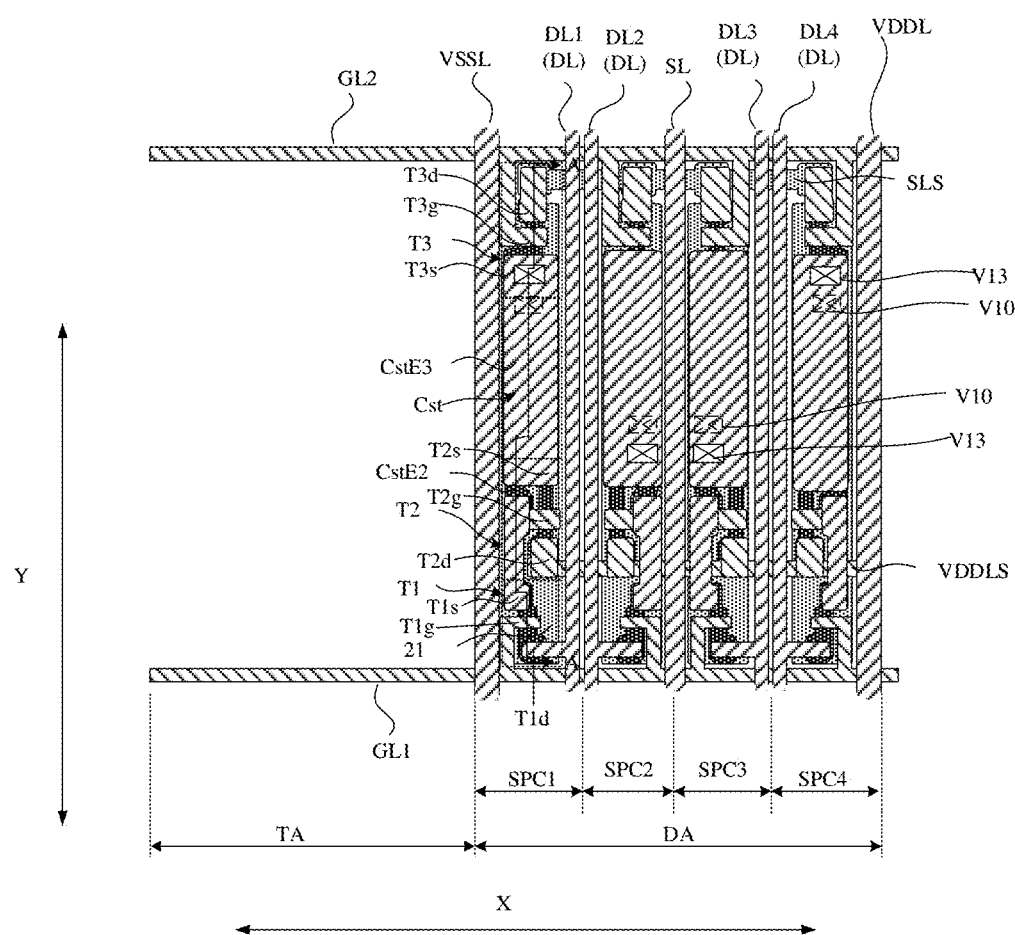
FIG. 25 is a schematic plan view of a single pixel after patterns of a fourth insulating layer and a planarization layer are formed in a manufacturing process of a transparent display panel according to some embodiments of the present disclosure.
Figure 26:
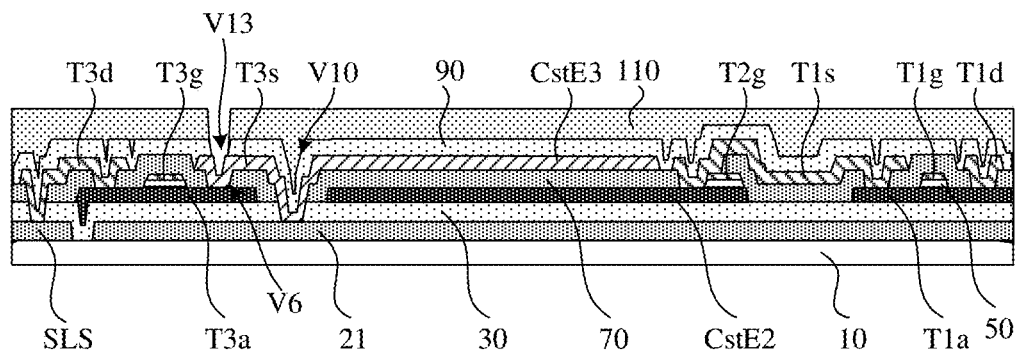
FIG. 26 is a schematic cross-sectional view along line A-A in FIG. 25.

FIG. 25 is a schematic plan view of a single pixel after patterns of a fourth insulating layer and a planarization layer are formed in a manufacturing process of a transparent display panel according to some embodiments of the present disclosure. FIG. 26 is a schematic cross-sectional view along line A-A in FIG. 25. As shown in FIGS. 25 and 26, patterns of the fourth insulating layer 90 and the planarization layer 110 are then formed. Specifically, a fourth insulating film is deposited on the base substrate 10 on which aforementioned patterns have been formed. A patterning process, such as exposure, development, and etching, is performed on the fourth insulating film, to form the pattern of the fourth insulating layer 90. The pattern of the fourth insulating layer 90 is provided with a via hole in each pixel sub-driving circuit. Then, a planarization film is coated on the base substrate 10 on which the pattern of the fourth insulating layer 90 is formed, and the pattern of the planarization layer 110 is formed through a patterning process of the planarization film, such as exposure, development, and etching. The pattern of the layer 110 is only provided in the display area DA of the pixel P, not in the light transmission area TA. The pattern of the planarization layer 110 is also provided with a via hole in each sub-pixel driving circuit. In each sub-pixel driving circuit, The via hole of the planarization layer 110 is aligned with the via hole in the fourth insulating layer 90, and the two form the thirteenth via hole V13 that penetrates the planarization layer 110 and the fourth insulating layer 90. The size of the thirteenth via hole V13 is obviously larger than other via holes. In some embodiments, as shown in FIGS. 25 and 26, in the first sub-pixel driving circuit SPC1 and the fourth sub-pixel driving circuit SPC4, the thirteenth via hole V13 is located at the position where the source T3s of the detection transistor T3 is located. Specifically, the thirteenth via hole V13 covers the sixth via hole V6, that is, the orthographic projection of the sixth via hole V6 on the base substrate 10 falls within the orthographic projection of the thirteenth via hole V13 on the base substrate 10. In this way, the layout space may be saved, and the opening area of the pixel defining layer formed subsequently may be as large as possible. The fourth insulating layer 90 and the planarization layer 110 in the thirteenth via hole V13 are etched off, to expose the surface of the source T3s of the detection transistor T3. In the second sub-pixel driving circuit SPC2 and the third sub-pixel driving circuit SPC3, the thirteenth via hole V13 is located at the position where the notch 43 of the second capacitor electrode CstE2 is located, and adjacent to the tenth via hole V10, in some embodiments, the thirteenth via hole V13 covers the fourteenth via hole V14, that is, the orthographic projection of the fourteenth via hole V14 on the base substrate 10 falls within the orthographic projection of the thirteenth via hole V13 on the base substrate 10. As a result, a combined-hole structure similar to that in the first sub-pixel driving circuit SPC1 and the fourth sub-pixel driving circuit SPC4 is formed, which improves the process uniformity. The fourth insulating layer 90 and the planarization layer 110 in the thirteenth via hole V13 are etched off to expose the surface of the third capacitor electrode CstE3. In each sub-pixel driving circuit, the thirteenth via hole V13 is adjacent to the tenth via hole V10, and the two are aligned in the second direction Y, that is, a straight line connecting a center of the thirteenth via hole V13 and a center of the tenth via hole V10 is parallel to the second direction Y. In the first sub-pixel driving circuit SPC1 and the fourth sub-pixel driving circuit SPC4, the thirteenth via hole V13 is closer to the second gate line GL2 than the tenth via hole V10. In the second sub-pixel driving circuit SPC2 and the third sub-pixel driving circuit SPC3, the thirteenth via hole V13 is farther away from the second gate line GL2 than the tenth via hole V10. Those skilled in the art should understand that the tenth via hole V10 of each sub-pixel driving circuit should be shielded by the fourth insulating layer 90 and the planarization layer 110, however, in order to clearly reflect the position relationship between the tenth via hole V10 and the thirteenth via hole V13, the tenth via hole V10 of each sub-pixel driving circuit is shown in a dotted pattern in FIG. 25. As shown in FIG. 25, the patterns of the fourth insulating layer 90 and the planarization layer 110 in the first sub-pixel driving circuit SPC1 and the patterns of the fourth insulating layer 90 and the planarization layer 110 in the fourth sub-pixel driving circuit SPC4 are approximately mirror-symmetrical relative to the position of the detection line SL. The patterns of the fourth insulating layer 90 and the planarization layer 110 in the second sub-pixel driving circuit SPC2 and the patterns of the fourth insulating layer 90 and the planarization layer 110 in the third sub-pixel driving circuit SPC3 are approximately mirror-symmetrical relative to the position of the detection line SL. After this patterning process, the light transmission area TA includes the first insulating layer 30, the third insulating layer 70, and the fourth insulating layer 90 stacked on the base substrate 10.

Figure 27:
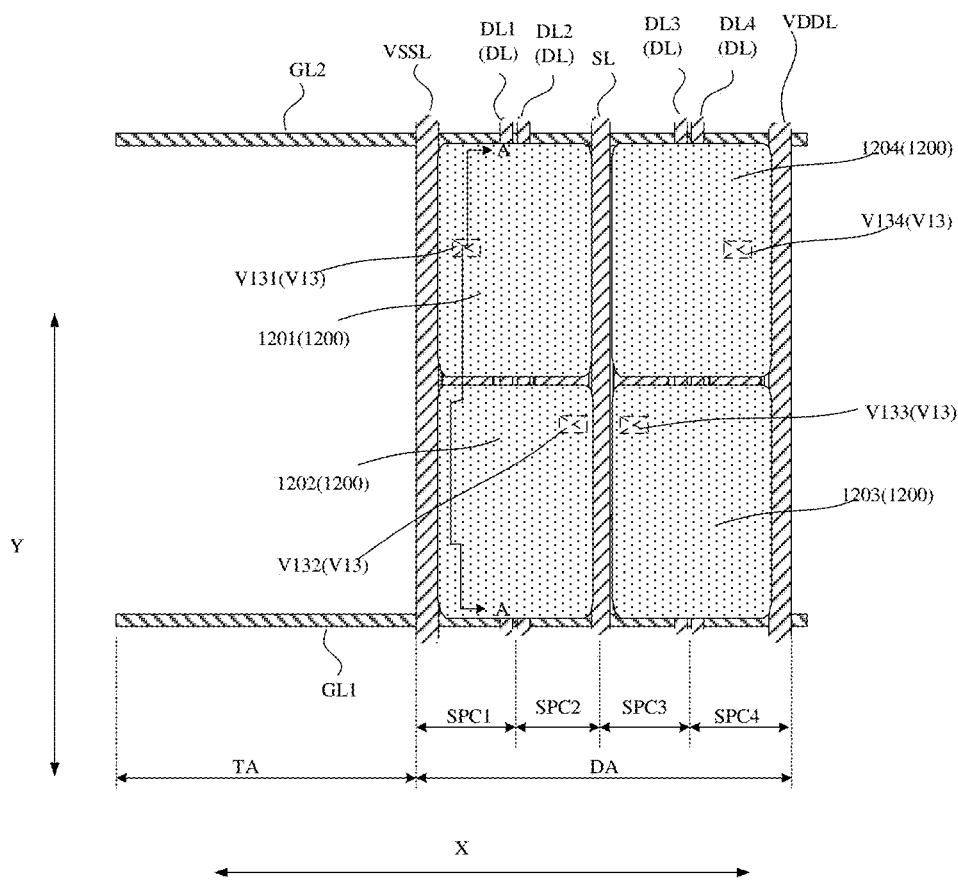
FIG. 27 is a schematic plan view of a single pixel after a pattern of an anode layer is formed in a manufacturing process of a transparent display panel according to some embodiments of the present disclosure.
Figure 28:
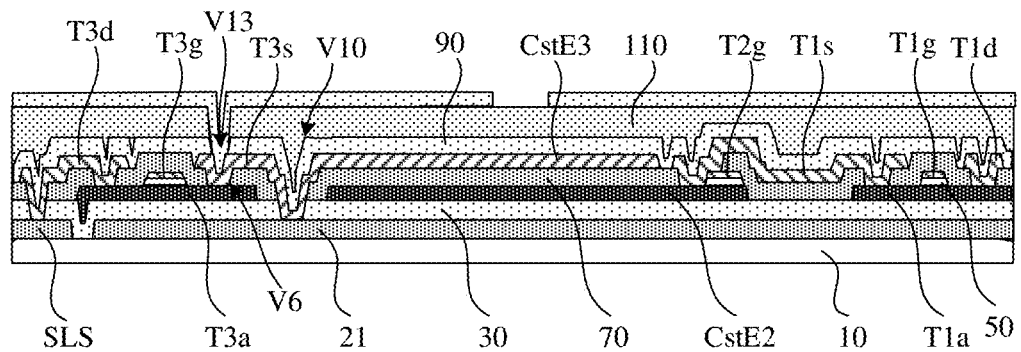
FIG. 28 is a schematic cross-sectional view along line A-A in FIG. 27.

FIG. 27 is a schematic plan view of a single pixel after a pattern of an anode layer is formed in a manufacturing process of a transparent display panel according to some embodiments of the present disclosure, and FIG. 28 is a schematic cross-sectional view along the line A-A in FIG. 27. As shown in FIGS. 27 and 28, a pattern of the anode layer 120 is then formed. Specifically, a conductive film, such as a laminated structure of aluminum, ITO, and aluminum, is deposited on the base substrate on which aforementioned patterns have been formed, and the conductive film is patterned through a patterning process to form the pattern of the anode layer 120 on the planarization layer 110. The anode layer 120 includes at least an anode 1200 of the light-emitting element D of each sub-pixel, that is, a first anode 1201 of a first light-emitting element of a first sub-pixel, a second anode 1202 of a second light-emitting element of a second sub-pixel, a third anode 1203 of a third light-emitting element of a third sub-pixel and a fourth anode 1204 of a fourth light-emitting element of a fourth sub-pixel. In each sub-pixel driving circuit, the source T2s of the driving transistor T2, the source T3s of the detection transistor T3, and the third capacitor electrode CstE3 are coupled to each other to form an integral structure. In each sub-pixel, the anode 1200 is electrically coupled to the integral structure through the thirteenth via hole V13 (also referred to as an anode via hole V13 herein) in the corresponding sub-pixel driving circuit, so that the anode 1200 of each sub-pixel is electrically coupled with the source T2s of the driving transistor T2 of the corresponding sub-pixel driving circuit. in FIG. 23, the thirteenth via hole V13 of each sub-pixel driving circuit should be shielded by the anode 1200, however, in order to clearly reflect the position relationship between the thirteenth via hole V13 and the anode 1200, the thirteenth via hole V13 of each sub-pixel driving circuit is shown by a dotted pattern in FIG. 27. In some embodiments, four anodes 1200 are all located in the display area DA, each anode 1200 may be rectangular, and the four anodes 1200 are arranged in a 2×2 matrix in the display area DA. In some embodiments, as shown in FIGS. 23 and 24, the first anode 1201 is located at the upper left and electrically coupled to the source T3s of the detection transistor T3 of the first sub-pixel driving circuit SPC1 through the thirteenth via hole V13 of the first sub-pixel driving circuit SPC1; the second anode 1202 is located at the lower left, and is electrically coupled to the third capacitor electrode CstE3 of the second sub-pixel driving circuit SPC2 through the thirteenth via hole V13 of the second sub-pixel driving circuit SPC2; the third anode 1203 is located at the lower right, and electrically coupled to the third capacitor electrode CstE3 of the third sub-pixel driving circuit SPC3 through the thirteenth via hole V13 of the third sub-pixel driving circuit SPC3; and the fourth anode 1204 is located at the upper right and electrically coupled to the source T3s of the detection transistor T3 of the fourth sub-pixel driving circuit SPC4 through the thirteenth via hole V13 of the fourth sub-pixel driving circuit SPC4.

In some embodiments, an arrangement of anode 1200 in the display area DA is adjustable according to actual needs, which is not specifically limited in the present disclosure. The anode layer 120 is usually not arranged in the light transmission area TA to ensure the light transmittance of the light transmission area TA. After this patterning process, the film structure of the light transmission area TA is unchanged.

Figure 29:
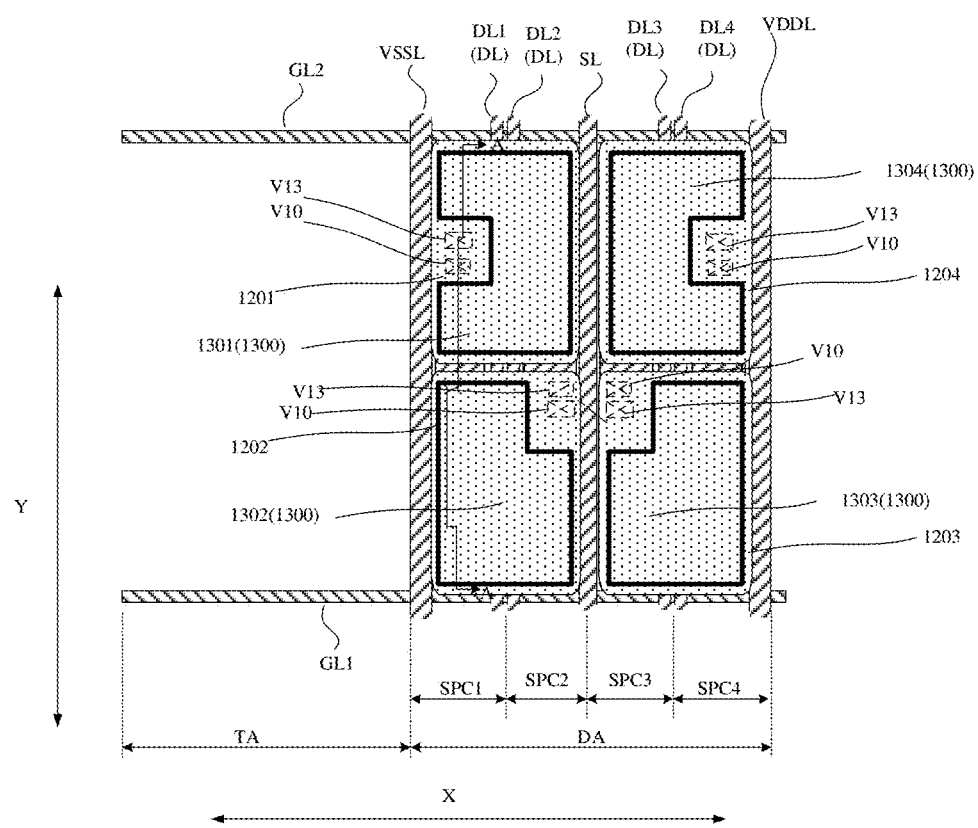
FIG. 29 is a schematic plan view of a single pixel after patterns of a pixel defining layer, a luminescent material layer, a cathode, and an encapsulation layer are formed in a manufacturing process of a transparent display panel according to some embodiments of the present disclosure.
Figure 30:
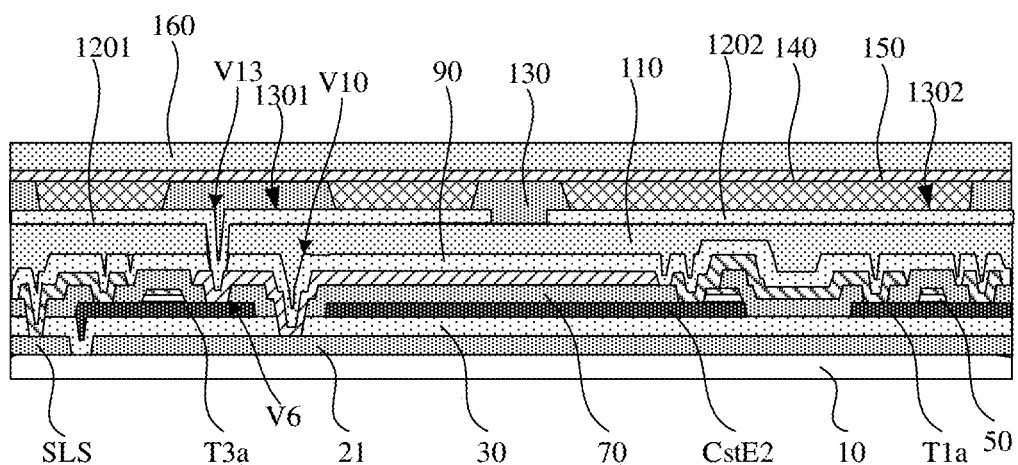
FIG. 30 is a schematic cross-sectional view along line A-A in FIG. 29.

FIG. 29 is a schematic plan view of a single pixel after patterns of a pixel defining layer, a luminescent material layer, a cathode, and an encapsulation layer are formed in a manufacturing process of a transparent display panel according to some embodiments of the present disclosure. FIG. 30 is a schematic cross-sectional view along line A-A in FIG. 29. For clarity, the patterns of the pixel defining layer, the luminescent material layer, the cathode, and the encapsulation layer are omitted, and only an opening of the pixel defining layer is shown. The pixel defining layer, the luminescent material layer, the cathode, and the encapsulation layer are shown in FIG. 30. As shown in FIGS. 29 and 30, the patterns of the pixel defining layer, the luminescent material layer, the cathode and the encapsulation layer are formed. Specifically, a pixel defining film layer is coated on the base substrate 10 on which aforementioned patterns have been formed, and the pattern of the pixel defining layer 130 is formed by processes of masking, exposure and developing. The pixel defining layer 130 has an opening 1300 corresponding to the anode 1200 of each sub-pixel, namely a first opening 1301, a second opening 1302, a third opening 1303, and a fourth opening 1304 respectively corresponding to the first anode 1201, the second anode 1202, the third anode 1203, and the fourth anode 1204. The first opening 1301, the second opening 1302, the third opening 1303, and the fourth opening 1304 respectively define the light-emitting regions of the first light-emitting element, the second light-emitting element, the third light-emitting element, and the fourth light-emitting element. An orthographic projection of each opening 1300 on the base substrate 10 falls within an orthographic projection of its corresponding anode 1200 on the base substrate, and each opening 1300 exposes a part of its corresponding anode 1200. Subsequently, in some embodiments, a luminescent material layer 140 is formed in the aforementioned opening 1300, and the luminescent material layer 140 is electrically coupled to the corresponding anode 1200. Optionally, in other embodiments, the luminescent material layer 140 is vapor-deposited on substantially the entire upper surface upper surface of the base substrate 10 on which the pixel defining layer 130 with the opening 1300 has been formed, and the luminescent material layer 140 located in the opening 1300 corresponds to the light-emitting area of each sub-pixel. Subsequently, a cathode film is deposited, and a pattern of the cathode layer 150 is formed through a patterning process. The cathode layer 150 includes at least the cathode of the light-emitting element D of each sub-pixel. The cathode layer 150 is electrically coupled to the luminescent material layer 140 and the second power line VSSL, respectively. In some embodiments, as shown in FIGS. 25 and 26, the cathodes of the light-emitting elements D of the sub-pixels constitute an integral structure. In some embodiments, the cathodes of the light-emitting elements D of the sub-pixels of the plurality of pixels P are all integrally formed and act as an integral structure covering the light transmission areas TA and the display areas DA of the plurality of pixels P. Subsequently, an encapsulation layer 160 is formed on the cathode layer 150. The encapsulation layer 160 is, for example, a laminated structure including an inorganic material/an organic material/an inorganic material. In some embodiments, the cathode layer 150 may be electrically coupled to the second power line VSSL in various ways, such as laser drilling, etc. In some embodiments, the cathode layer 150 may be electrically coupled to the second power line VSSL through a via hole. The anode layer may be formed in the via hole to form a connecting electrode to electrically connect the second power line VSSL and the cathode. In some embodiments, the cathode 150 substantially covers the entire surface of the base substrate 10. There are peripheral wirings in the peripheral area of the display panel, and the peripheral wirings are also coupled to the VSS voltage signal. In the peripheral area of the display panel, the cathode layer 150 is electrically coupled to the peripheral wirings. After this process, in some embodiments, the light transmission area TA may include a base substrate 10 and a first insulating layer 30, a third insulating layer 70, a fourth insulating layer 90, a cathode layer 150 and encapsulation layer 160 disposed on the base substrate 10. Those skilled in the art may understand that the first insulating layer 30, the third insulating layer 70, the fourth insulating layer 90, the cathode layer 150, and the encapsulation layer 160 in the light transmission area TA are not necessary. In some embodiments, in the formation process of the above-mentioned layers, the above-mentioned layers in the light transmission area TA may be removed according to actual needs.

In some embodiments, the light transmission area TA of the pixel P is surrounded by a first gate line GL1, a second gate line GL2, a second power line VSSL corresponding to the pixel P, and a first power line VDDL corresponding to another pixel P adjacent to the pixel P.

Some embodiments of the present disclosure provide an electronic device, specifically a transparent electronic device including the transparent display panel described in any of the embodiments. The transparent electronic device may be used for products or components with see-through and display functions, such as see-through shop windows, vehicle windows, etc.

The above description is only some embodiments of the present disclosure and an explanation of the applied technical principles. Those skilled in the art should understand that the scope of the contents involved in the present disclosure is not limited to the technical solutions formed by the specific combination of the above technical features, and should also cover other technical solutions formed by any combination of the above technical features and equivalent features thereof without departing from the inventive concept, for example, a technical solution formed by replacing the above-mentioned features with the technical features having similar functions which are disclosed in this disclosure (but not limited to this).

What is claimed is:

1. A pixel driving circuit, comprising:
a first sub-pixel driving circuit, a second sub-pixel driving circuit, a third sub-pixel driving circuit, and a fourth sub-pixel driving circuit sequentially arranged in a first direction;
a detection line extending in a second direction substantially perpendicular to the first direction and located between the second sub-pixel driving circuit and the third sub-pixel driving circuit, wherein the detection line is configured to obtain a detection sampling signal from each sub-pixel driving circuit;
one first power line extending in the second direction and configured to provide a constant first voltage signal to each sub-pixel driving circuit; and
one second power line extending in the second direction and configured to provide a constant second voltage signal to a pixel where the pixel driving circuit is located,
wherein the pixel where the pixel driving circuit is located comprises a light-emitting element, and the second power line is electrically coupled to a cathode of the light-emitting element, and
wherein each sub-pixel driving circuit comprises:
a first transistor comprising a first gate, a first drain, and a first source, wherein the first gate receives a first scan signal;
a second transistor comprising a second gate, a second drain, and a second source and configured to control a current used to drive the light-emitting element under a control of a voltage at the gate of the second transistor, wherein the second gate is electrically coupled to the first source, the second drain is electrically coupled to the first power line, and the second source is electrically coupled to an anode of the light-emitting element, and;
wherein one of the first power line and the second power line is provided on a side of the second sub-pixel driving circuit away from the third sub-pixel driving circuit, and the other of the first power line and the second power line is provided on a side of the third sub-pixel driving circuit away from the second sub-pixel driving circuit, and a distance between the first power line and the second power line in the first direction is greater than or equal to a width of the pixel driving circuit in the first direction.

2. The pixel driving circuit according to claim 1, wherein the first power line is provided on a side of the first sub-pixel driving circuit away from the second sub-pixel driving circuit, and the second power line is provided on a side of the fourth sub-pixel driving circuit away from the third sub-pixel driving circuit.

3. The pixel driving circuit according to claim 1, wherein the first power line is provided on a side of the fourth sub-pixel driving circuit away from the third sub-pixel driving circuit, and the second power line is provided on a side of the first sub-pixel driving circuit away from the second sub-pixel driving circuit.

4. The pixel driving circuit according to claim 1, further comprising:
a first data line extending in the second direction, wherein the first data line is located between the first sub-pixel driving circuit and the second sub-pixel driving circuit, and configured to provide a first data signal to the first sub-pixel driving circuit;
a second data line extending in the second direction, wherein the second data line is located between the first sub-pixel driving circuit and the second sub-pixel driving circuit, and configured to provide a second data signal to the second sub-pixel driving circuit;
a third data line extending in the second direction, wherein the third data line is located between the third sub-pixel driving circuit and the fourth sub-pixel driving circuit, and configured to provide a third data signal to the third sub-pixel driving circuit; and
a fourth data line extending in the second direction, wherein the fourth data line is located between the third sub-pixel driving circuit and the fourth sub-pixel driving circuit, and configured to provide a fourth data signal to the fourth sub-pixel driving circuit.

5. The pixel driving circuit according to claim 4, wherein:
the first data line is located between the first sub-pixel driving circuit and the second data line; and
the second data line is located between the first data line and the second sub-pixel driving circuit.

6. The pixel driving circuit according to claim 4, wherein:
the third data line is located between the third sub-pixel driving circuit and the fourth data line; and
the fourth data line is located between the third data line and the fourth sub-pixel driving circuit.

7. The pixel driving circuit according to claim 4, wherein the detection line, the first power line, the second power line, the first data line, the second data line, the third data line, and the fourth data line are made of the same material and provided in the same layer.

8. The pixel driving circuit according to claim 4, wherein each sub-pixel driving circuit further comprises:
a third transistor comprising a third gate, a third drain, and a third source, wherein the third gate receives a second scan signal, the third drain is electrically coupled to the detection line, and the third source is electrically coupled to the second source.

9. The pixel driving circuit according to claim 8, further comprising:
a detection connection line extending in the first direction, wherein
the detection line is electrically coupled to the third drain of the third transistor of each sub-pixel driving circuit through the detection connection line.

10. The pixel driving circuit according to claim 8, further comprising:
a power connection line extending in the first direction, wherein
the first power line is electrically coupled to the second drain of the second transistor of each sub-pixel driving circuit through the power connection line.

11. A display panel, comprising:
a base substrate; and
a plurality of pixels arranged in an array on the base substrate,
wherein each of the plurality of pixels comprises a light transmission area and a display area that are arranged side by side in a first direction; and
each pixel comprises the pixel driving circuit according to claim 1, and
wherein the pixel driving circuit is located in the display area.

12. The display panel according to claim 11, wherein in each pixel, the first sub-pixel driving circuit is closer to the light transmission area than the second sub-pixel driving circuit, the third sub-pixel driving circuit, and the fourth sub-pixel driving circuit, and the second power line is provided between the light transmission area and the first sub-pixel driving circuit.

13. The display panel according to claim 11, wherein in each pixel, the fourth sub-pixel driving circuit is closer to the light transmission area than the first sub-pixel driving circuit, the second sub-pixel driving circuit, and the third sub-pixel driving circuit, and the second power line is provided between the light transmission area and the fourth sub-pixel driving circuit.

14. The display panel according to claim 11, wherein in each pixel, the first sub-pixel driving circuit is closer to the light transmission area than the second sub-pixel driving circuit, the third sub-pixel driving circuit, and the fourth sub-pixel driving circuit, and the second power line is provided on a side of the fourth sub-pixel driving circuit away from the light transmission area.

15. The display panel according to claim 11, wherein in each pixel, the fourth sub-pixel driving circuit is closer to the light transmission area than the first sub-pixel driving circuit, the second sub-pixel driving circuit, and the third sub-pixel driving circuit, and the second power line is provided on a side of the first sub-pixel driving circuit away from the light transmission area.

16. The display panel according to claim 11, wherein the plurality of pixels comprise a first pixel and a second pixel arranged sequentially in the first direction, the display area of the first pixel is adjacent to that of the second pixel, and the pixel driving circuit of the first pixel and the pixel driving circuit of the second pixel share one first power line.

17. The display panel according to claim 11, wherein the plurality of pixels comprises a first pixel and a second pixel arranged sequentially in the first direction, the display area of the first pixel is adjacent to that of the second pixel, and the pixel driving circuit of the first pixel and the pixel driving circuit of the second pixel share one electrode auxiliary line.

18. An electronic device comprising the display panel according to claim 11.

* * * * *